(12) United States Patent
Kobayashi et al.

(10) Patent No.: US 6,600,160 B2
(45) Date of Patent: *Jul. 29, 2003

(54) PHOTOELECTRIC CONVERTER AND RADIATION READER

(75) Inventors: Isao Kobayashi, Atsugi (JP); Masakazu Morishita, Hiratsuka (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/252,073

(22) Filed: Feb. 18, 1999

(65) Prior Publication Data

US 2002/0056810 A1 May 16, 2002

(30) Foreign Application Priority Data

Feb. 20, 1998 (JP) ............................... 10-038872
Feb. 12, 1999 (JP) ............................... 11-034470

(51) Int. Cl.$^7$ .................................................. H04N 3/14
(52) U.S. Cl. .............................. 250/370.14; 250/370.09
(58) Field of Search ....................... 250/370.14, 370.09, 250/370.11, 208.1, 208.3

(56) References Cited

U.S. PATENT DOCUMENTS

| 4,866,291 | A | * | 9/1989 | Shimada et al. | 250/208.1 |
|---|---|---|---|---|---|
| 5,059,794 | A | * | 10/1991 | Takahashi et al. | 250/327.2 |
| 5,182,624 | A | | 1/1993 | Tran et al. | 257/40 |
| 5,381,014 | A | | 1/1995 | Jeromin et al. | 250/370 |
| 5,420,352 | A | | 5/1995 | Koga et al. | 564/353 |
| 5,498,880 | A | | 3/1996 | Lee et al. | 250/580 |
| 5,591,960 | A | * | 1/1997 | Furukawa et al. | 250/208.1 |
| 5,604,364 | A | * | 2/1997 | Ohmi et al. | 250/208.1 |
| 5,619,033 | A | | 4/1997 | Weisfield | 250/208.1 |
| 5,698,844 | A | | 12/1997 | Shinohara et al. | 250/214 R |
| 5,812,284 | A | * | 9/1998 | Mizutani et al. | 250/208.3 |
| 5,912,465 | A | * | 6/1999 | Kobayashi et al. | 250/370.09 |
| 5,914,485 | A | * | 6/1999 | Kobayashi et al. | 250/208.1 |
| 6,034,725 | A | | 3/2000 | Franklin et al. | 348/310 |
| 6,075,256 | A | * | 6/2000 | Kaifu et al. | 250/370.09 |
| 6,144,466 | A | * | 11/2000 | Mizutani et al. | 250/208.1 |
| 6,147,338 | A | * | 11/2000 | Takahashi | 250/208.1 |

FOREIGN PATENT DOCUMENTS

| JP | 5-267636 | 10/1993 |
|---|---|---|
| JP | 8-116044 | 5/1996 |
| JP | 8-343150 | 12/1996 |
| JP | 10-190038 | 7/1998 |

\* cited by examiner

Primary Examiner—Constantine Hannaher
Assistant Examiner—Otilia Gabor
(74) Attorney, Agent, or Firm—Fitzpatrick, Cella, Harper & Scinto

(57) ABSTRACT

To prevent an output voltage from lowering due to increase of a parasitic capacitance when arranging a plurality of photoelectric conversion elements, a photoelectric conversion element, a reading field-effect transistor having a gate for receiving signal charges generated in the photoelectric conversion element and a source and a drain for reading a signal corresponding to signal charges accumulated in the gate, selection switch means set between the reading field-effect transistor and a power supply, and reset means for resetting the gate are provided on an insulating support body.

40 Claims, 19 Drawing Sheets

(X-ray IRRADIATION IS CONTINUOUS)

PHOTOELECTRIC CONVERTER AND RADIATION READER

BACKGROUND OF THE INVENTION

1. Field of the Invention

The present invention relates to a photoelectric converter and a radiation reader, more particularly to a photoelectric converter capable of performing the read operation at higher sensitivity and higher speed and a radiation reader capable of reading the information for radiation represented by (α-rays, β-rays, γ-rays or x-rays at a high sensitivity.

2. Related Background Art

In the case of a photoelectric converter and a radiation reader for reading the information based on radiation by wavelength-converting the radiation into the sensitivity region of the photoelectric converter with a wavelength converter such as a photoluminescent body (for example, scintillator), electric charges based on the input information photoelectric-converted by a photoelectric-converting section is transferred to a capacitance to amplify a signal voltage.

However, to amplify a signal voltage by transferring electric charges from the capacitance of a photoelectric-conversion element itself to an external capacitance like the case of reading signal charges with a conventional circuit, a relatively-large S/N ratio can be obtained but a parasitic capacitance may be formed on a signal line when arranging a plurality of sensors. For example, when arranging 2,000× 2,000 area sensors equivalent to an X-ray film at a size of 200×200 μm per cell and manufacturing an area sensor with a size of 40×40 cm, a capacitance is formed because the gate and source of a transistor for transferring electric charges are overlapped each other. Because the above overlap corresponds to the number of pixels, one signal line has an overlap $C_{gs}$ capacitance of 0.05 pF×2,000 area sensors=100 pF even if one area sensor has a capacitance of approx. 0.05 pF. Because a sensor capacitance $C_s$ is equal to approx. 1 pF, when assuming a signal voltage generated in a sensor as $V_1$, the output voltage $V_0$ of the signal line is obtained from the following expression.

$$V_0=(C_s/(C_s+C_{gs}\times1000))\times V_1$$

Thus, the output voltage lowers to 1/100.

That is, to constitute an area sensor having a large area, an output voltage is greatly lowered.

Moreover, to read a dynamic image under the above condition, a sensitivity and a high-speed operation capable of reading 30 images per sec. or more are requested. Particularly, in the case of a nondestructive inspection including X-ray diagnosis, higher sensitivity allowing the number of signal charges to increase up to 100 to 400 times is requested because there is a request for minimizing the dose of X-rays to be irradiated.

SUMMARY OF THE INVENTION

The present invention is made to solve the above problems and its object is to provide a photoelectric converter capable of preventing an output voltage from lowering due to increase of a parasitic capacitance and resultantly having higher sensitivity and more-advanced performance and a radiation reader having the photoelectric converter.

It is another object of the present invention to provide a photoelectric converter having a large opening ratio, that is, a large rate of the light-receiving-section region in an area necessary for one pixel and resultantly capable of achieving a high sensitivity and an advanced performance and a radiation reader having the photoelectric converter.

It is still another object of the present invention to provide a photoelectric converter capable of reading a dynamic image.

It is still another object of the present invention to provide a radiation reader capable of further reducing the dose of radiation such as X-rays.

It is still another object of the present invention to provide a photoelectric converter having a semiconductor layer comprising in one pixel: a photoelectric conversion element, a reading field-effect transistor having a gate for receiving signal charges generated in the photoelectric conversion element and a source and a drain for reading a signal corresponding to the signal charges accumulated in the gate, selection-switch means set between the reading field-effect transistor and a power supply, and reset means for resetting the gate; wherein the photoelectric conversion element, the reading field-effect transistor, the selection-switch means, and the reset means are formed on a common insulating support body.

It is still another object of the present invention to provide a radiation reader comprising a photoelectric converter having a semiconductor layer comprising in one pixel: a photoelectric conversion element, a reading field-effect transistor having a gate for receiving signal charges generated in the photoelectric conversion element and a source and a drain for reading a signal corresponding to the signal charges accumulated in the gate, selection-switch means set between the reading field-effect transistor and a power supply, and reset means for resetting the gate; wherein the photoelectric conversion element, the reading field-effect transistor, the selection-switch means, and the reset means are formed on a common insulating support body; and a photoluminescent body set on the photoelectric conversion element to absorb radiation and emit light in a wavelength band which can be detected by the photoelectric conversion element.

It is still another object of the present invention to provide a radiation reader having the following in one pixel: a radiation reading element which includes an electric-charge discharging layer for absorbing radiation and discharging electric charges and in which at least the electric-charge discharging layer is constituted so as to be held by two conductive layers, a reading field-effect transistor having a gate for receiving signal charges generated in the radiation reading element and a source and a drain for reading a signal corresponding to the signal charges accumulated in the gate, selection-switch means set between the reading field-effect transistor and a power supply, and reset means for resetting the gate.

DETAILED DESCRIPTION OF THE PREFERRED EMBODIMENTS

Embodiments of the present invention are described below by referring to the accompanying drawings. A radiation reader of the present invention for reading the information based on radiation is not restricted to an X-ray reader described below but it can be also applied to a reader for reading the information based on (α-rays, β-rays, and γ-rays. (First Embodiment)

Figure 1:
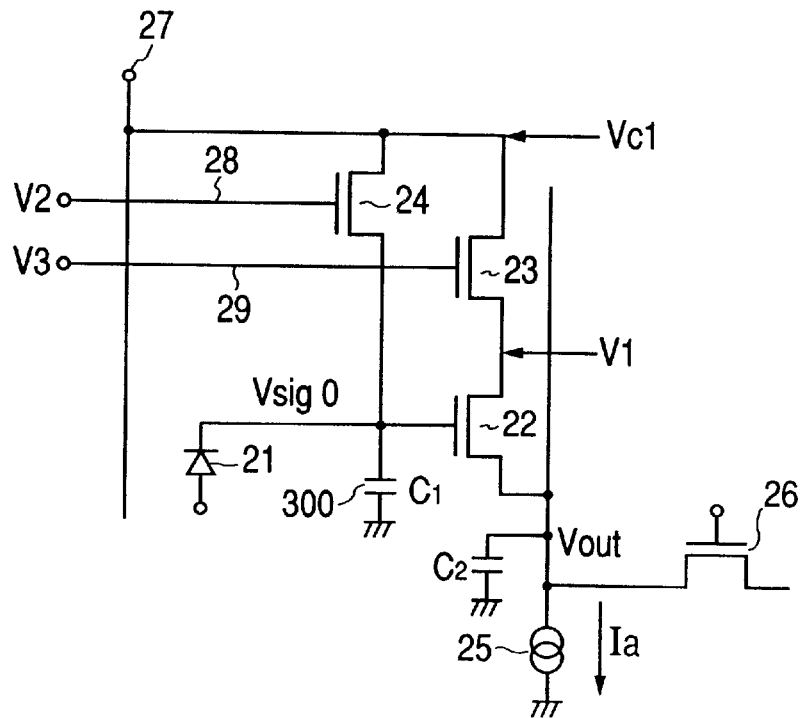
FIGS. 1, 10 and 13 are schematic circuit diagrams for explaining one-pixel portion of the photoelectric section of a photoelectric converter.
Figure 2:
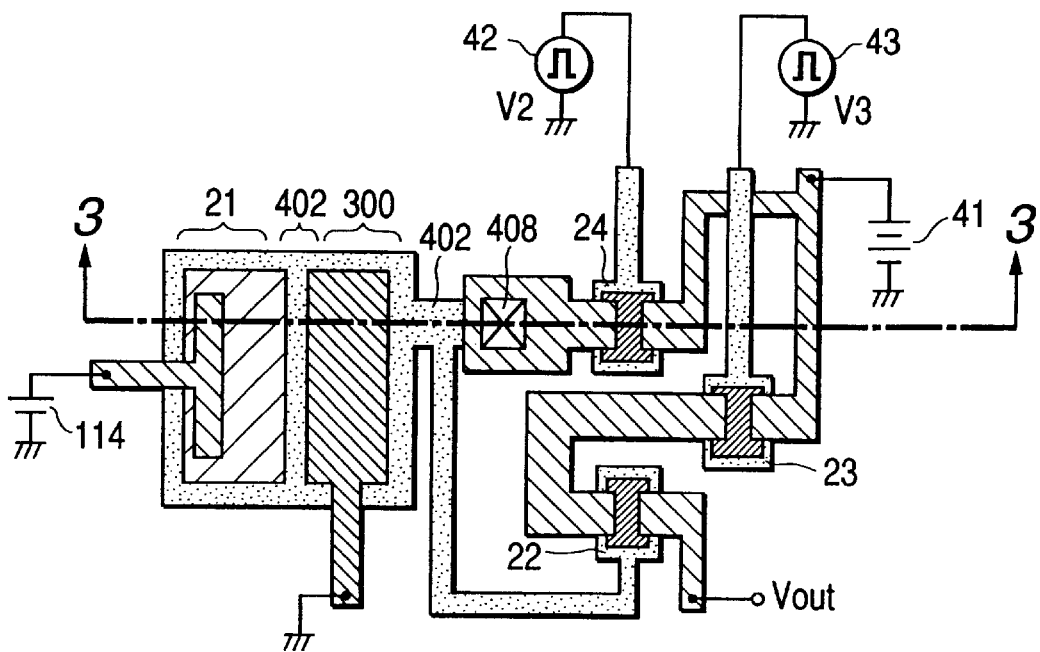
FIG. 2 is a schematic plan view for explaining a structure corresponding to the schematic circuit diagram of FIG. 1.
Figure 3:
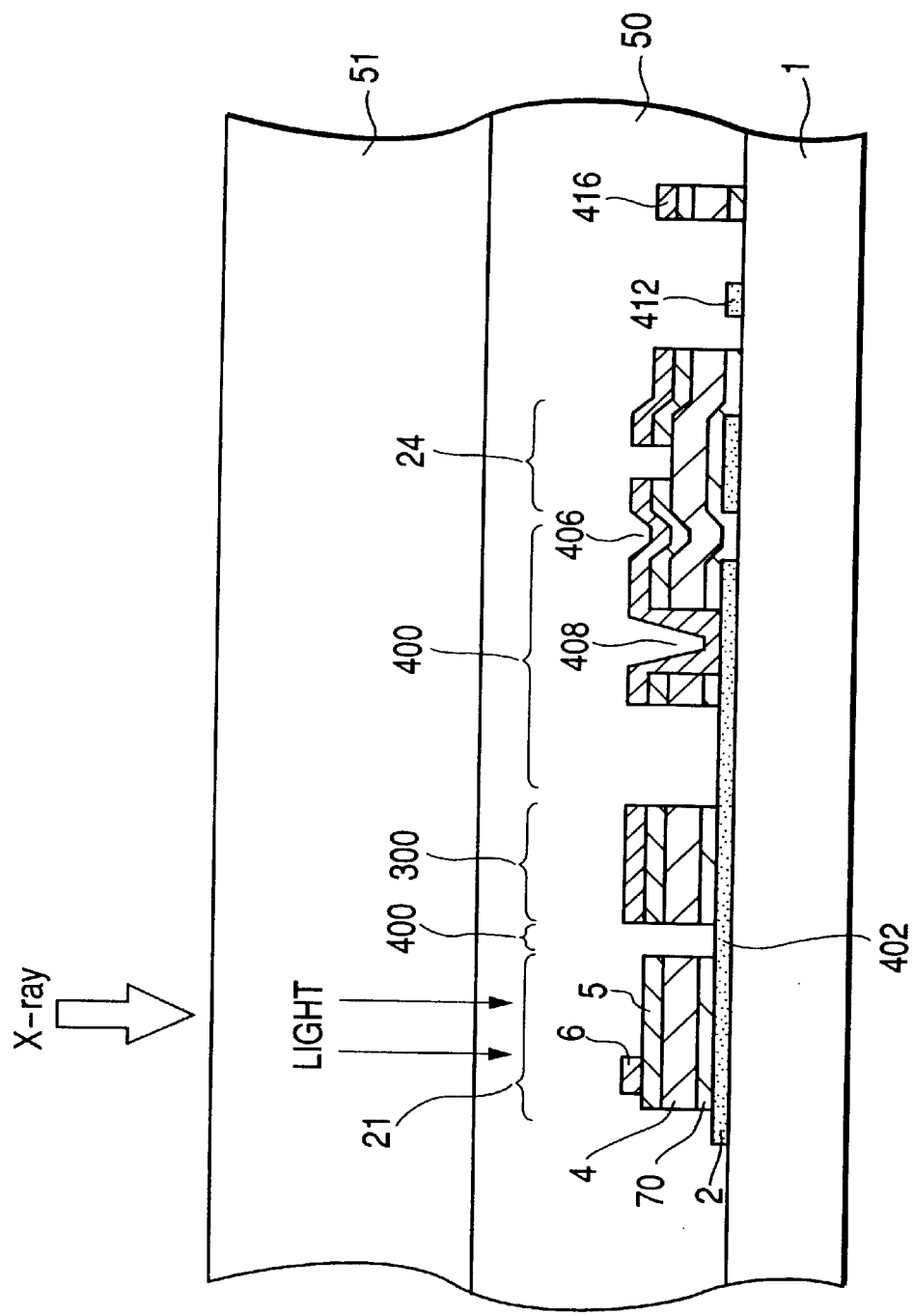
FIG. 3 is a schematic sectional view of the structure of FIG. 2, taken along the line 3—3 of FIG. 2.

FIG. 1 is a schematic circuit diagram showing one-pixel portion of a photoelectric converter of the present invention. FIG. 2 is a schematic plan view of the radiation reader shown in FIG. 1 and FIG. 3 shows a case of combining the radiation reader of FIG. 2 with a wavelength converting body to use the combination as a radiation reader, which is a schematic sectional view between A and B shown by the schematic plan view of FIG. 2.

In each drawing, symbol 21 denotes a photoelectric conversion element, 300 denotes a capacitor for accumulating signal charges sent from the photoelectric conversion element 21, 22 denotes a MOS transistor to which the photoelectric conversion element 21 and a gate are connected, 23 denotes a MOS transistor serving as selection-switch means for selecting each pixel, 24 denotes a MOS transistor serving as reset means for resetting the gate of the MOS transistor 22 and the capacitor 300, 25 denotes a current source, 26 denotes a MOS transistor for outputting a signal, 27 denotes a terminal to be connected with a voltage source, 28 denotes a reset gate line, 29 denotes a vertical gate line, and 41 denotes a voltage source. Moreover, symbol $V_2$ and $V_3$ denote signals to be applied to the gates of the MOS transistors 24 and 23, 42 and 43 denote signal sources for outputting the signals $V_2$ and $V_3$. When the photoelectric conversion element 21 has a sufficient capacitance, it is not always necessary to use the capacitor 300.

As shown in FIG. 1, the photoelectric conversion element 21 is connected to the gate of the MOS transistor 22 so as to be able to amplify and output a signal sent from a photoelectric conversion element. Therefore, it is possible to prevent an output voltage from lowering due to increase of a parasitic capacitance when arranging a plurality of photoelectric conversion elements. Moreover, a photoelectric conversion element of the present invention is not restricted to a photoelectric conversion element having the same layer structure as a thin-film transistor (TFT) described below.

Methods for forming elements are described below in order by referring to FIGS. 2 and 3. In this case, an X-ray-signal reader is described. A MOS transistor is constituted with a TFT.

First, Cr is deposited up to a thickness of approx. 500 Å as a lower metal layer 2 on a glass substrate 1 serving as an insulating material through sputtering and then, patterned through photolithography to etch unnecessary areas. Thereby, the lower electrode of the photoelectric conversion element 21, the gate electrodes of the MOS transistors (TFT) 22 to 24, the lower electrode of the capacitor 300, and lower wirings 402 and 412 are formed.

Then, an SiN (silicon nitride) layer 70, an i layer 4, and an n layer 5 are deposited in order up to thicknesses of approx. 2,000 Å, 5,000 Å, and 500 Å by the CVD method in the same vacuum state. These layers serve as the insulating layer, photoelectric-conversion semiconductor layer, and hole-injection preventive layer of the photoelectric conversion element 21, the gate insulating layers, semiconductor layers, and ohmic contact layers of the TFTs 22 to 24, and the intermediate layer of the capacitor 300. Moreover, they are used as crossing-portion insulating layers of upper and lower wirings. Thicknesses of the layers are not restricted to the above values. It is possible to most preferably design each of the thicknesses in accordance with the voltage, current, electric charge, or incoming luminous energy used for a photoelectric converter. However, a thickness of 500 Å or more not allowing electrons and a hole to pass and capable of functioning as the gate insulating film of a TFT is preferable.

After each layer is deposited, an area serving as a contact hole 408 is etched and then, Al is deposited up to a thickness of approx. 10,000 Å as the upper metal layer 6 through sputtering or the like. Moreover, by patterning the Al film through photolithography and etching unnecessary areas, the upper electrode of the photoelectric conversion element 21, the source and drain electrodes serving as main electrodes of the TFTs 22 to 24, the upper electrode of the capacitor 300, and the upper wirings 406 and 416 are formed. At the same time, the lower wiring 402 and the upper wiring 406 are connected each other in the contact hole 408.

Moreover, by etching the n layers of only the channel sections of the TFTs 22 to 24 with a RIE and then, etching the unnecessary SiN layer 70, i layer 4, and n layer 5, each element is separated. Thus, the photoelectric conversion element 21, TFTs 22 to 24, lower wirings 402 and 412, and upper wirings 406 and 416, and contact hole 408 are completed.

Furthermore, to improve the durability, the upper side of each element is normally covered with a passivation film 50 of SiN or the like to form a photoluminescent body layer 51 on the film 50 as a wavelength conversion body. Incoming X-rays is converted by the photoluminescent body layer 51 into the light (typically, visible light) having a wavelength band which can be converted by the photoelectric conversion element 21.

As described above, the photoelectric converter is able to form the common lower metal layer 2, SiN layer 70, i layer 4, n layer 5, and upper metal layer 6 on which the photoelectric conversion element 21, TFTs 22 to 24, and capacitor 300, and a wiring section 400 are simultaneously deposited by only etching each layer. Moreover, only one injection preventive layer is present in the photoelectric conversion element 21 and the layers can be formed in the same vacuum state. Furthermore, it is possible to form a gate insulating film and an i layer which are important for characteristics of a TFT in the same vacuum state. Furthermore, because the intermediate layer of the capacitor 300 includes an insulating layer not easily causing a leak due to heat, the capacitor 300 is formed by having preferable characteristics. Thus, the photoelectric converter can be manufactured at a low cost with an advanced performance.

The above forming method can use amorphous silicon. When it is requested to improve the operation speed of a TFT, however, it is possible to improve the operation speed by forming an amorphous silicon layer and thereafter, changing the layer to a polysilicon layer through laser annealing.

(Second Embodiment)

Figure 4:
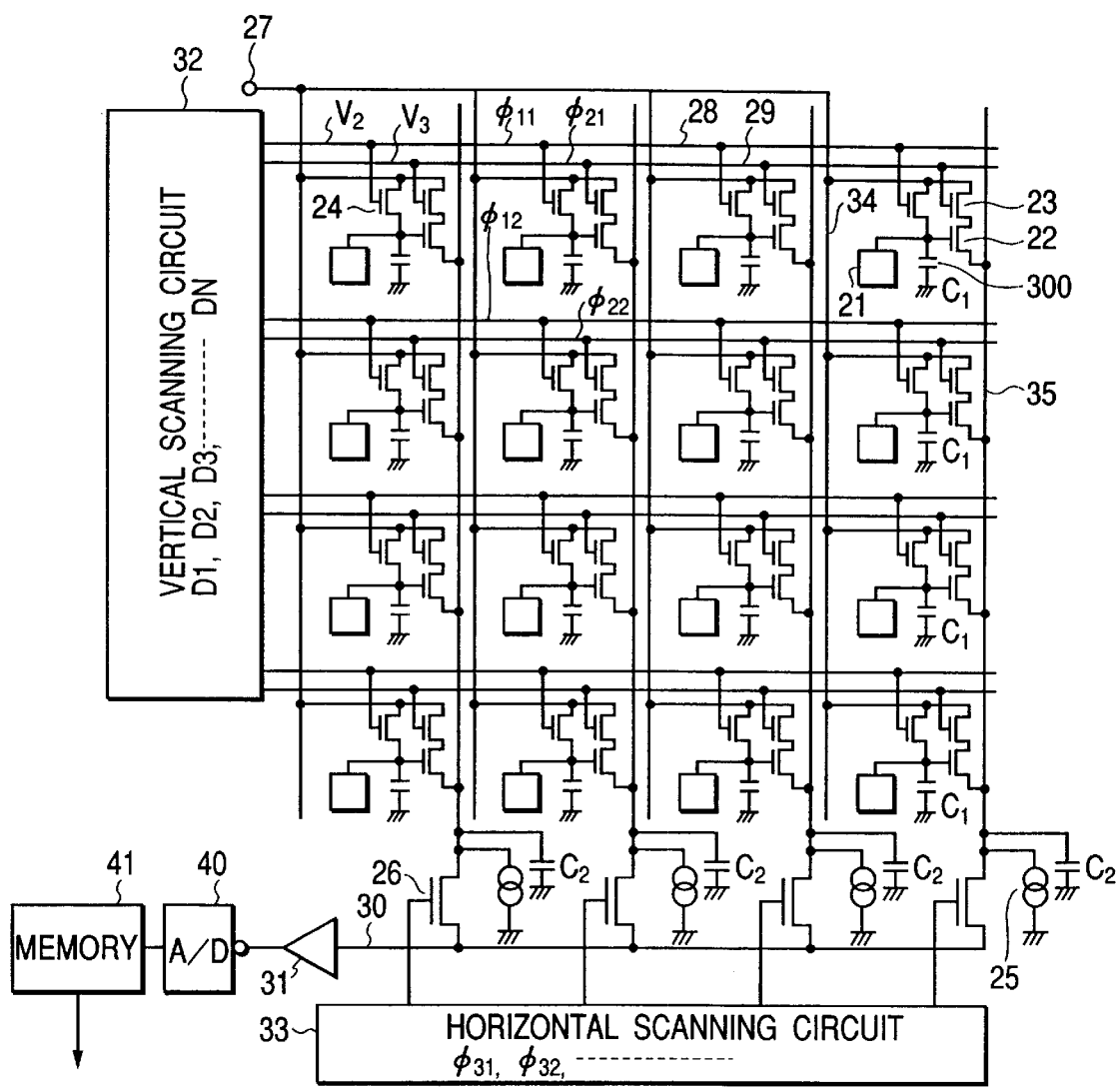
FIG. 4 is a schematic circuit diagram showing a case of arranging two or more pixels of FIG. 1 like a matrix.

FIG. 4 is a schematic circuit diagram showing a photoelectric converter of the present invention. This embodiment makes it possible to output signals through successive scanning by arranging one-pixel portions of the photoelectric converter in FIG. 1 like a matrix. Also, this embodiment is described below in accordance with a case of applying the embodiment as a radiation reader by using a wavelength conversion body.

In FIG. 4, the photoelectric converter (photodiode or the like) 21 accumulates electric charges corresponding to the incoming luminous energy of the light in a photosensitive wavelength region obtained through photosensitive-conversion of X-rays. The photoelectric conversion element 21 is two-dimensionally arranged. Also in this case, when the photoelectric conversion element 21 has a sufficient capacitance, the capacitor 300 added to each pixel is unnecessary. One end of the photoelectric conversion element 21 is connected to the gate of a source-follower input MOS (Metal Oxide Silicon Transistor) 22, the drain of the source-follower input MOS 22 is connected to the source of a vertical selection-switch MOS 23 and the source is connected to the load current source 25 through a vertical output line 35, and the drain of the vertical selection-switch MOS (transistor) 23 is connected to the power-supply terminal 27 through a power-supply line 34 and these components constitute a source follower circuit.

Moreover, symbol 24 denotes a reset switch, and its source is connected to the gate of the source-follower input MOS 22 and its drain is connected to the power-supply terminal 27 through the power-supply line 34.

When a signal voltage is generated in the gate of the source-follower input MOS 22 correspondingly to the electric charges accumulated in the photoelectric conversion element of each pixel, the above source follower circuit reads the signal voltage with the current amplified.

The gate of the vertical selection-switch MOS 23 is connected to a vertical scanning circuit 32 by a vertical gate line 29. The gate of the reset switch 24 is connected to the vertical scanning circuit 32 by a reset gate line 28. Moreover, the output signal of the source follower circuit is output to an external unit through the vertical output line 35, the horizontal transfer MOS switch 26, a horizontal output line 30, and an output amplifier 31. The gate of the horizontal transfer MOS switch 26 is connected to a horizontal scanning circuit 33.

Operations of this circuit are described below. First, the circuit resets the photoelectric conversion element 21 by the reset switch 24. Then, the circuit starts accumulation. A signal voltage is generated in the gate of the source-follower input MOS 22 correspondingly to the accumulated signal charges. After the accumulation time passes, signals of pixels selected by the vertical scanning circuit 32 and horizontal scanning circuit 33 are amplified by the source follower circuit and then, successively output through the output amplifier 31.

The structure of this circuit has advantages that a compact layout is realized because the power-supply line and reset power-supply line of the source follower are used in common and a source-follower output having a high linearity is obtained because the selection switch 23 is set to the power-supply side and thereby, the resistance of the selection switch 23 is absent between the source end and the constant-current source of the source-follower input MOS 22.

Then, an example of driving of the circuit of FIG. 4 is described below by referring to FIG. 5.

FIG. 4 is a timing chart showing an example of driving timing. In the case of this example, X-rays are continuously irradiated. Symbols $D_1$, $D_2$, $D_3$, ..., and DH denote driving of rows. For example, $D_1$ shows each timing related to the first row. In $D_1$, $\phi_{11}$ output from the vertical scanning circuit 32 denotes a reset pulse, $\phi_{21}$ denotes a drive pulse for all lines of one row, and $\phi_{31}$ denotes a read pulse output from the horizontal scanning circuit 33. Thereby, the read pulse is sent to an analog-to-digital conversion circuit (A/D) 40 through the output amplifier 31 and stored in an X memory 41.

The potential of the photoelectric conversion element 21 on one-row line is reset by a pulse $\phi_{RESET1}$ in accordance with the reset pulse $\phi_{11}$, the light due to X-ray irradiation is detected by the photoelectric conversion element 21 for the time of approx. $(T_1-T_2)$ to accumulate electric charges in a capacitor $C_1$ 300. A transistor 23 is turned on by a pulse $\phi_{Drive1}$ to transfer a potential to each column $C_2$. Then, potentials are successively output to the A/D from each column in accordance with a pulse $\phi_{Read1}$ through the output amplifier 31.

Thereafter, rows are read from $D_2$ to $D_N$.

The time of $T_1$ is equal to 33 msec ($T_1 \cong 1/30$ sec) in the case of, for example, 30 frames per sec. When photoelectric conversion elements are arranged by 500×500 in rows and columns, it is necessary to read from $D_1$ to D500, $T_2$ becomes almost equal to $T_1/500$ which is equal to approx. 66 $\mu$sec, $T_3$ becomes equal to $T_2/500$ which is equal to approx. 130 $\mu$sec.

These times are determined by the number of frames and the number of pixels for 1 sec.

Figure 6:
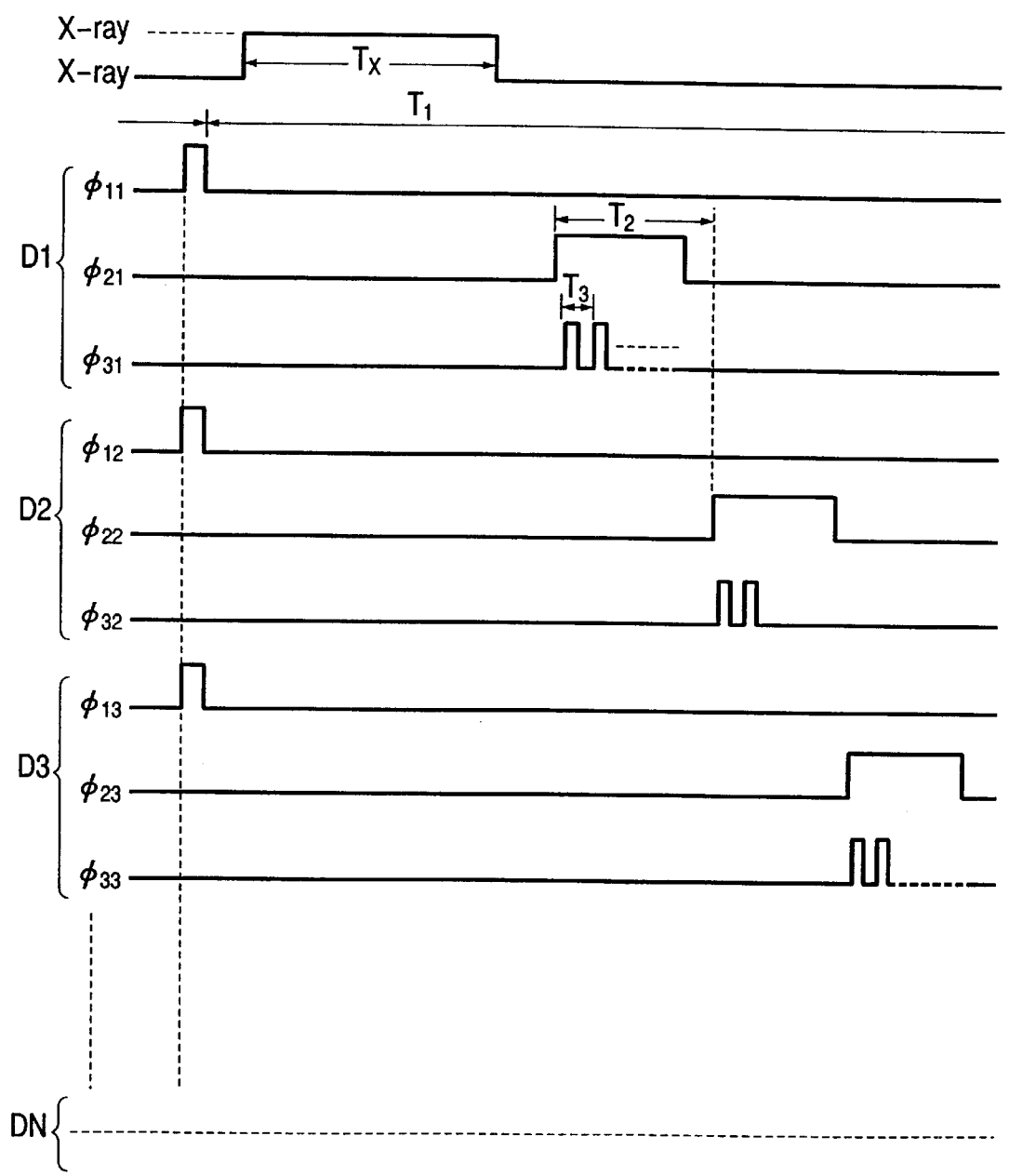

For the above driving example, a case is described in which X-rays are continuously irradiated. FIG. 6 shows a case of intermittently irradiating X-rays like a pulse as the second driving method.

In the case of this example, since lines of all rows of a photoelectric conversion element are simultaneously reset, they are reset by reset pulses $\phi_{11}$, $\phi_{31}$, ... $\phi_{1n}$. Then, X-rays are irradiated like a pulse for a time Tx.

Figure 5:
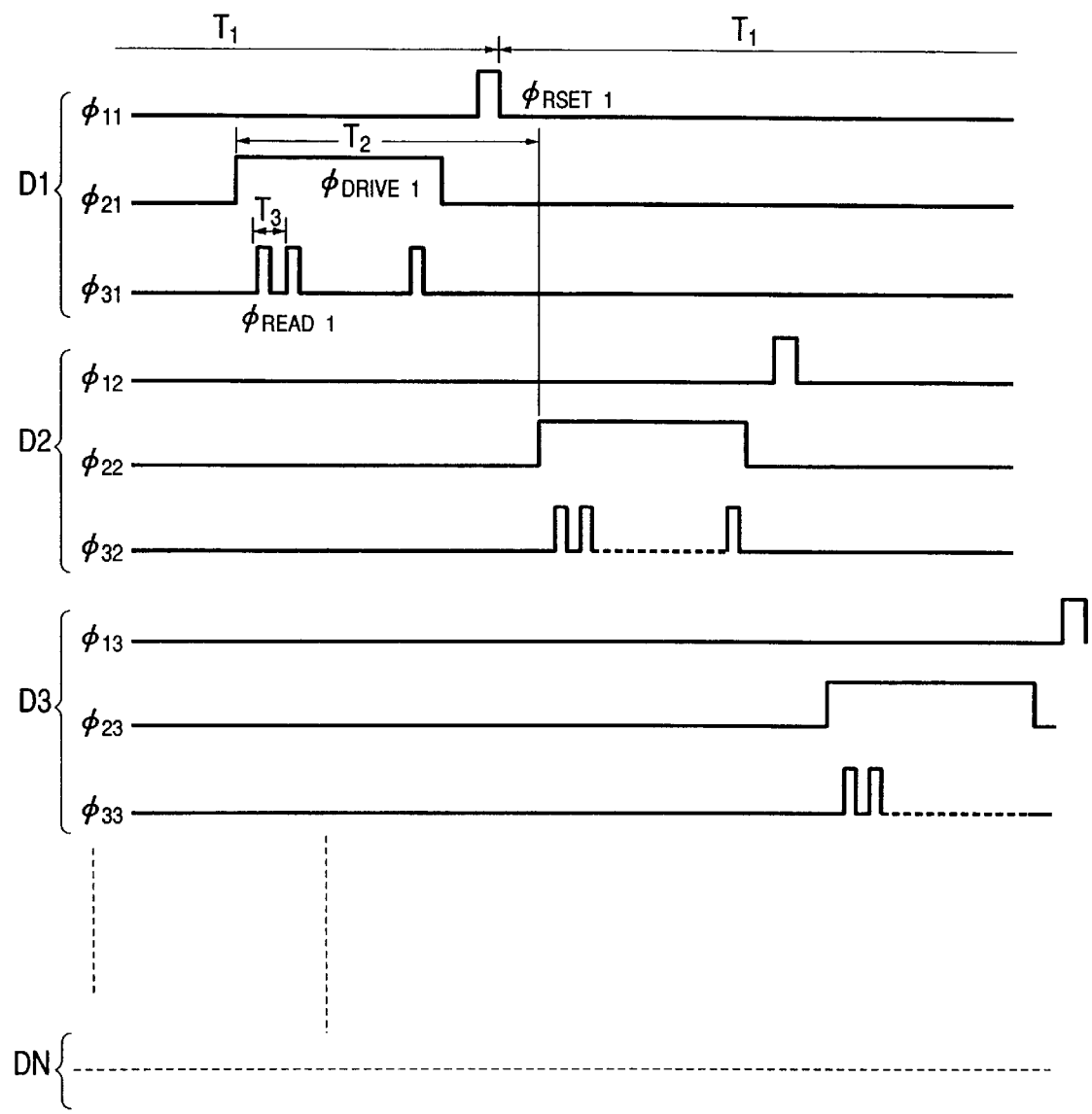
FIGS. 5, 6, 11, and 14 are timing charts for explaining a case of driving when applying a radiation reader and a photoelectric converter.

Thereafter, electric charges are successively read in accordance with the pulses $\phi_{21}$, $\phi_{31}$, ..., $\phi_{2n}$, and $\phi_{3n}$ similarly to the case of the first driving described for FIG. 5.

In the case of this example, an X-ray-pulse irradiation time Tx is required. Therefore, how to determine $T_2$ and $T_3$ is slightly different from the case of the above example. For example, when assuming that the number of pixels and the number of frames same as the case of the above example are used, $T_2$ is almost equal to $(T_1-T_x)/500$, $T_1$ is almost equal to 1/30s, and $T_3$ is almost equal to $T_2/500$.

To completely derive the performance of a sensor, a problem may occur that the influence of a dark current during the accumulation time or the fluctuation of the offset potential of the source follower (SF) of each cell appears as fixed-pattern noises.

In the first and second driving methods, the first method for eliminating fixed-pattern noises previously stores the output data of each element when X-rays are not irradiated in a memory and subtracts the dark current and the noises due to the offset potential of the SF from the output under X-ray irradiation. Thereby, it is possible to improve the sensor characteristic.

In the second driving method, the second method executes a series of sequences not performing X-ray irradiation and uses the output when no X-ray irradiation is performed as noise data (N). Moreover, the photoelectric conversion output when X-ray irradiation is uniformly performed is used as (signal+noise) data values (S+N) and the difference {(S+N)−N} between the data values is calculated to obtain a signal output. Thereby, it is possible to correct noises.

(Third Embodiment)

Figure 7:
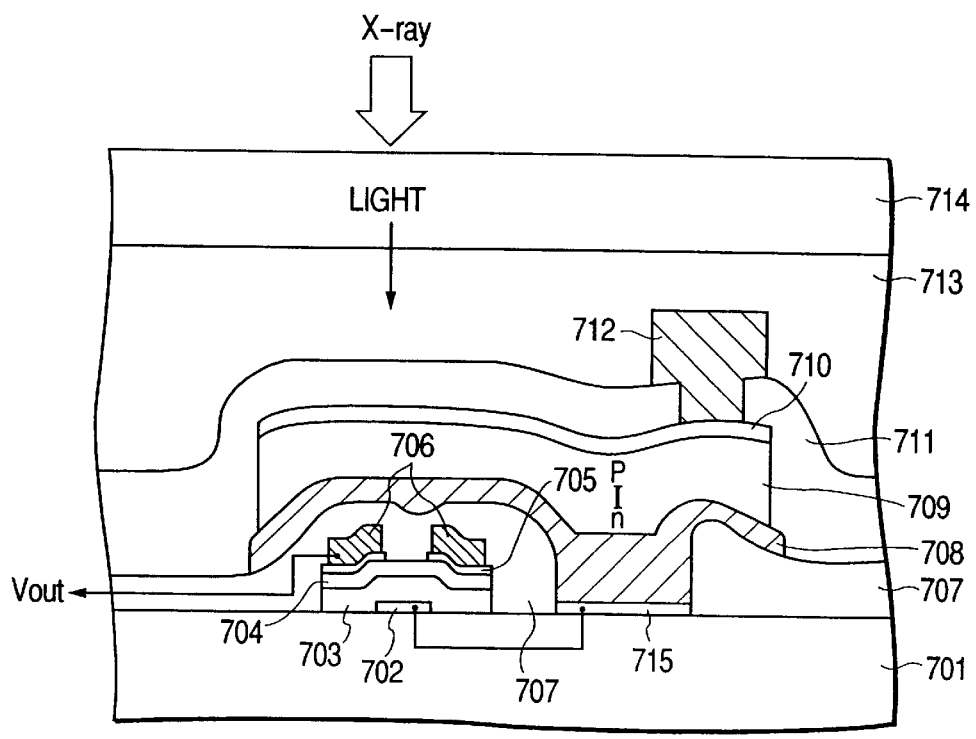
FIGS. 7, 8 and 9 are schematic sectional views for explaining a radiation reader.

FIG. 7 is a schematic sectional view showing the structure of another embodiment in which a photoelectric converter of the present invention is applied to a radiation reader. It is possible to use the circuit of FIG. 4 as an electric circuit. In FIG. 7, a PIN-type photodiode sensor has an upper electrode constituted with an ITO 710 and a first Al layer 712 serves as a wiring for supplying a negative potential to the ITO electrode 710. A lower electrode is constituted with a second Al layer 708 and the second Al layer 708 is also formed on the upper side of thin-film transistors (for amplification, selection-switch, and reset transistor) through an insulating layer (SiN layer) 707. Symbol 711 denotes an insulating film made of SiN or the like and 709 denotes a PIN junction layer.

The second Al layer 708 serving as the lower electrode of the PIN-type photodiode sensor is connected with a Cr layer 715 and the Cr layer 715 is connected with a gate electrode 702 of the thin-film transistor for amplification (in FIG. 7, connection between the Cr layer 715 and the gate electrode 702 is schematically shown).

The thin-film transistors (for amplification, selection-switch, and reset transistor) are constituted by being superimposed with the Cr gate electrode 702, an insulating layer 703, a semiconductor layer 704, an ohmic layer 705, and a source-drain electrode 706 on a glass substrate 701.

Moreover, it is possible to fabricate a capacitor by setting a Cr electrode below the second Al layer 708 through an insulating layer made of SiN or the like similarly to the structure of FIG. 8.

Because a PIN-type photodiode sensor has a sensitivity in visible light, when using the sensor as a reader for radiation such as X-rays, a photoluminescent body 714 serving as a wavelength conversion body for converting X-rays into visible light is set on the upper side of the sensor through an insulting layer 713 made of PI (polyimide, $SiO_2$, or $SiN_4$) as shown in FIG. 7.

In the case of the structure of this embodiment, the PIN-type photodiode sensor and respective thin-film transistors (for amplification, selection-switch, and resetting) can use amorphous silicon or polysilicon.

This embodiment above described makes it possible to obtain the following advantages.

(1) Because a PIN-type photodiode sensor is also set on each thin-film transistor (though only an amplification transistor is illustrated in the form of a sectional view, selection-switch and reset transistors are actually included), it is possible to set a sensor opening ratio to a value closed to approx. 100% and further increase an S/N ratio.

(2) When constituting the area sensor equivalent to an X-ray film shown in the conventional example by amplifying the signal charges accumulated by a PIN-type photodiode sensor with the amplifier (source follower amplifier) used for the first embodiment, it is possible to improve S/N correspondingly to the amplification factor of the amplifier.

According to the above Items (1) and (2), it is possible to remarkably improve an S/N ratio compared to the case of a conventional area sensor (for example, an opening ratio is improved two times by the structure in Item (1) and charge amplification is improved 100 times by the structure in Item (2), and resultantly the S/N ratio is remarkably improved).

(Fourth Embodiment)

Figure 8:
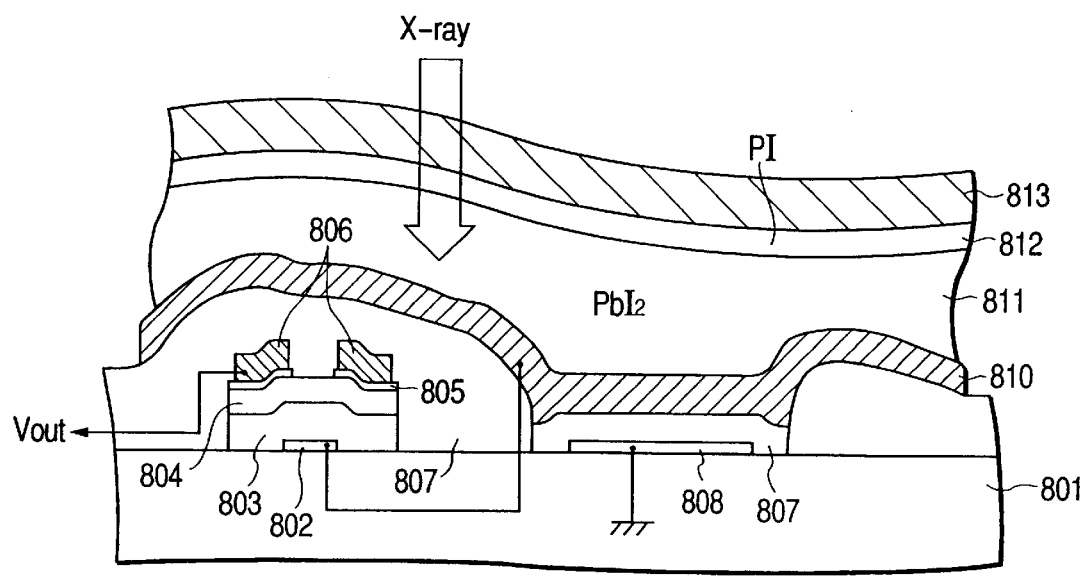
Figure 9:
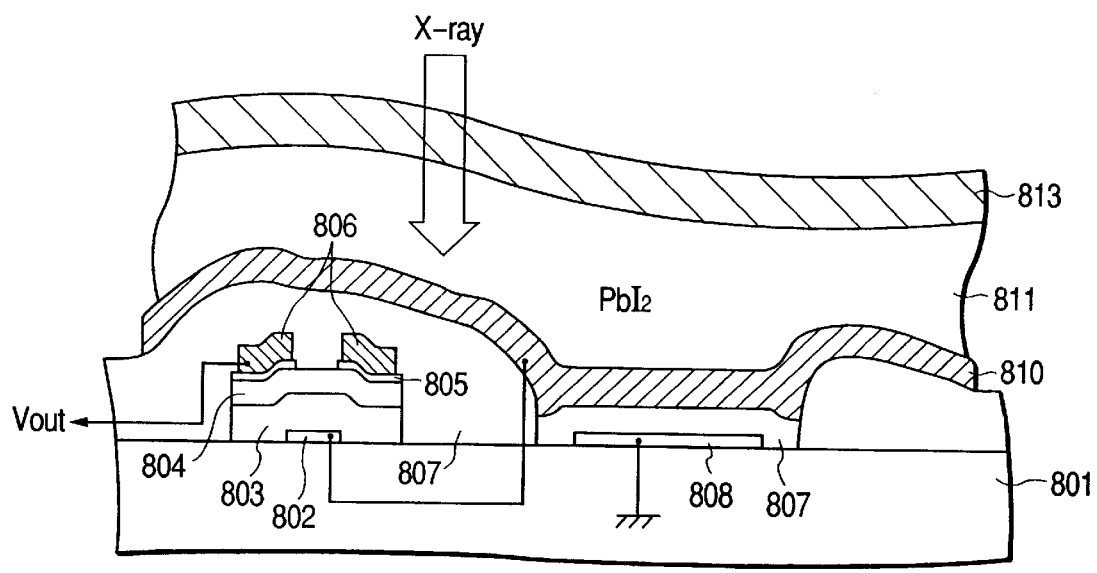

FIG. 8 is a schematic sectional view showing the structure of an embodiment in which a photoelectric converter of the present invention is applied to a radiation reader. It is possible to use an embodied circuit by applying FIG. 4. In FIG. 8, an X-ray-direct-conversion-type sensor mainly made of $PbI_2$ constitutes the upper electrode with a first Al layer 813 and the lower electrode with a second Al layer 810. By setting an insulating layer 812 made of PI (polyimide) or the like between the first Al layer 813 and $PbI_2$ 811 of the upper electrode, it is prevented that electric charges are injected into the $PbI_2$ 811 from the first Al layer 813 of the upper electrode. Moreover, in the case of this embodiment, it is possible to directly take out the electric charges due to incoming of X-rays by holding a material such as a-Sel, $PbI_2$, $HgI_2$, or PbO (in this case, $PbI_2$ is used) for producing a lot of electron-hole pairs in accordance with incoming of X-rays with upper and lower electrodes and applying an electric field between the upper and lower electrodes. The insulating layer 812 shown in FIG. 8 is not always necessary. As shown in FIG. 9, it is possible to sufficiently take out output charges from a sensor not having the insulating layer 812 as outputs.

A signal-charge accumulating capacitor is constituted with the second Al layer 810 of the lower electrode and the lowest Cr layer 808 to accumulate signal charges generated due to incoming of X-rays in the capacitor. Symbol 807 denotes an insulating film made of SiN or the like.

In this case, the second Al layer 810 of the lower electrode is also formed on thin-film transistors (for amplification, selection switch, and resetting) through the insulating layer (SiN layer) 807 as shown in FIG. 7 of the third embodiment.

The second Al layer 810 serving as the upper electrode of the accumulating capacitor is connected with the gate electrode 802 of the amplifying thin-film transistor, serving as a lowest Cr layer (in FIG. 8, connection between the second Al layer 810 and the gate electrode 802 is schematically shown).

The thin-film transistors (for amplification, selection-switch, and reset transistors) are constituted by being superimposed with the Cr gate electrode 802, an insulting layer 803, a semiconductor layer 804, an ohmic layer 805, and a source-drain electrode 806 on a glass substrate 801.

In the case of the structure of this embodiment, the thin-film transistor (for amplification, selection-switch, and resetting) can also use amorphous silicon or polysilicon similarly to the case of the third embodiment.

According to the above embodiments, the following advantages can be obtained.

(1) Because an X-ray-direct-conversion-type sensor is also set on each thin-film transistor (though only an amplification transistor is illustrated in the form of a sectional view, selection-switch and reset transistors are actually included), it is possible to set a sensor opening ratio to a value closed to approx. 100% and further increase the opening ratio approx. two times.

(2) Because an X-ray-direct-conversion-type sensor mainly made of $PbI_2$ does not require that a photoluminescent body converts X-rays into visible light, it has a high collection efficiency after converting incoming X-rays into electric signal charges and resultantly, is superior in the efficiency of conversion from incoming X-rays into electric signal charges.

Moreover, because a direct-conversion material is able to effectively collect electric charges in accordance with an electric field, it is possible to make the thickness relatively thick, increase the X-ray collection value, and raise the quantum efficiency.

(3) By amplifying the signal charges accumulated by an X-ray-direct-conversion-type sensor mainly made of $PbI_2$ or the like with the amplifier (sour-follower amplifier) used for the first embodiment, S/N is improved compared to the case of the conventional type (transistor type).

(Fifth Embodiment)

Figure 10:
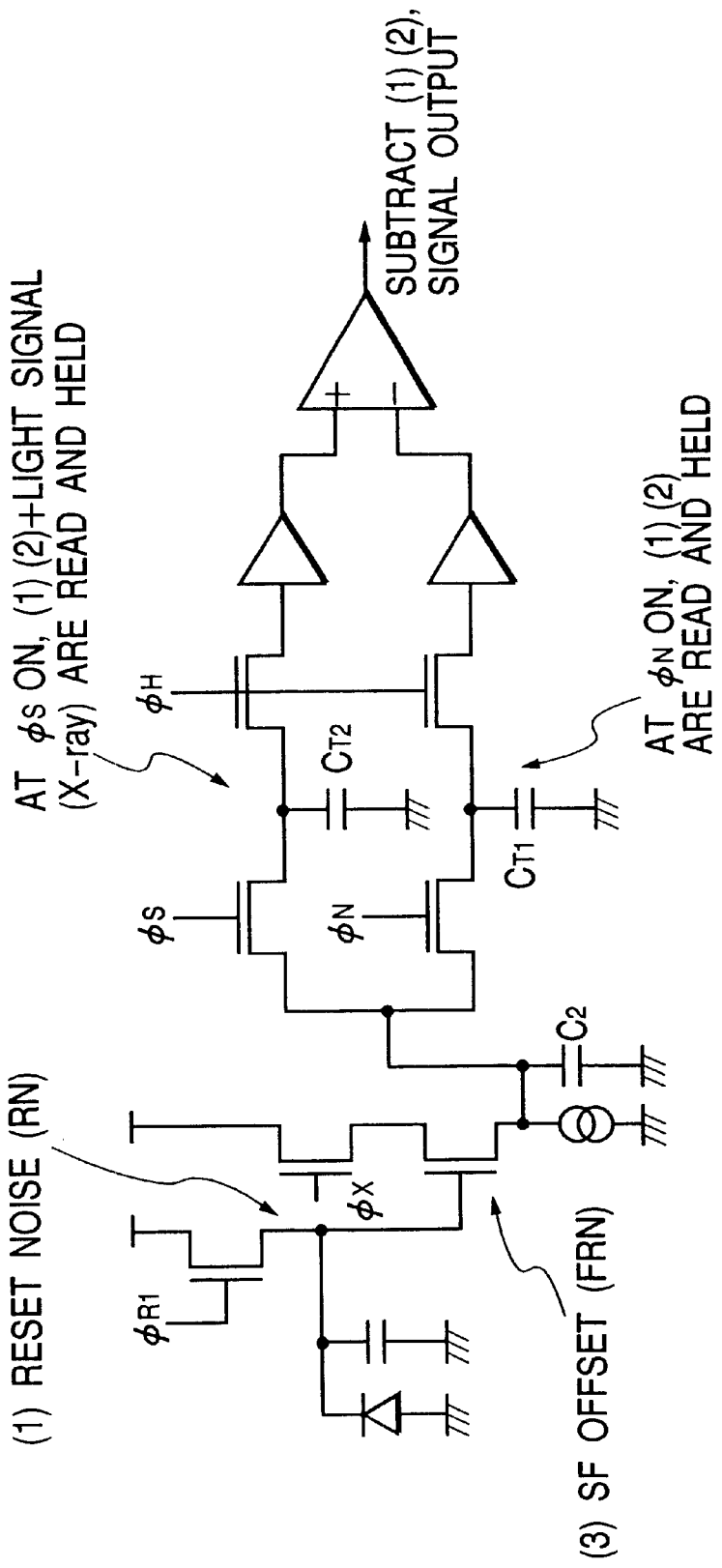
Figure 11:
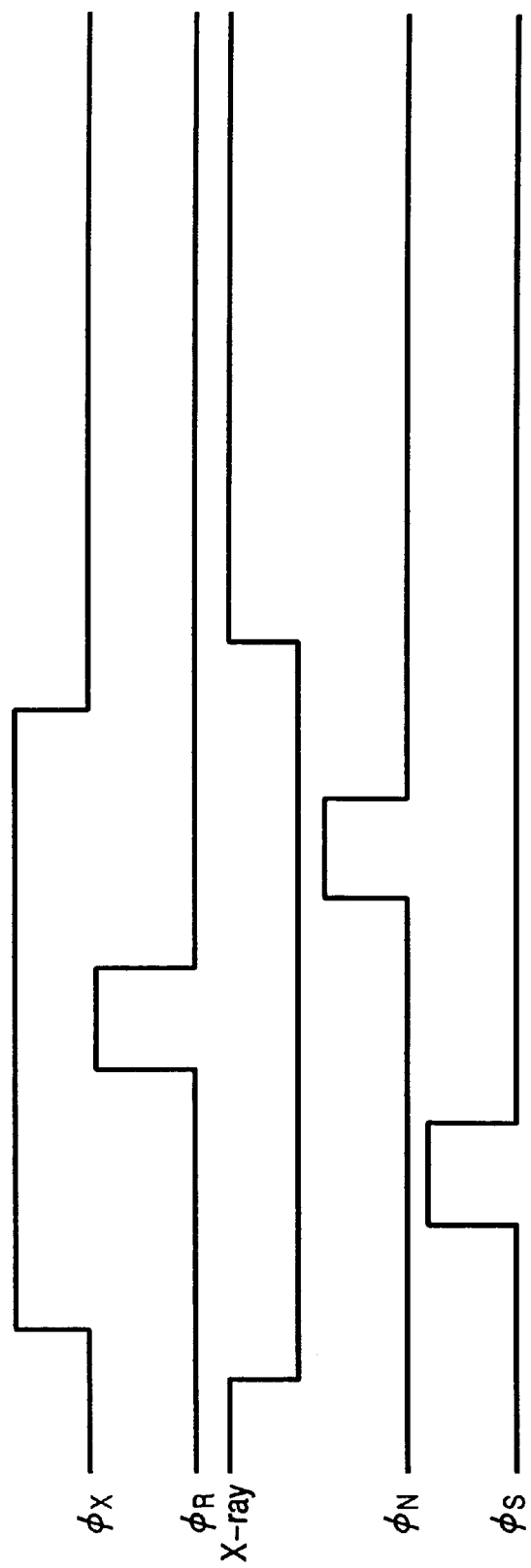

FIG. 10 shows another example of circuit applicable to the first to fourth embodiments. The circuit shown in FIG. 10 is able to subtract an SF offset or the like from a signal. FIG. 11 shows an example of timing of each of signals $\phi_X$, $\phi_R$, $\phi_N$, and $\phi_S$. In FIG. 10, symbol <1> denotes a reset random noise generated when resetting a sensor accumulation terminal section with a reset transistor and <2> denotes an offset-fixing pattern noise generated in a source follower section. X-rays show X-ray irradiation timing. However, it is also possible to continuously irradiate X-rays.

To eliminate the above two types of noises, capacitors $C_{T1}$ and $C_{T2}$ are arranged similarly to the case of the circuit of FIG. 10 to transfer signals accumulated in a dark state to the capacitor $C_{T1}$ in accordance with the pulse $\phi_N$ and signals accumulated in a bright state to the capacitor $C_{T2}$ in accordance with the pulse $\phi_S$, and input the signals in the capacitors $CT_2$ and $C_{T1}$ to a differential amplifier in accordance with the pulse $\phi_H$ and perform subtraction processing. Thereby, it is possible to obtain a sensor signal excluding the above noises <1> and <2>.

Figure 12:
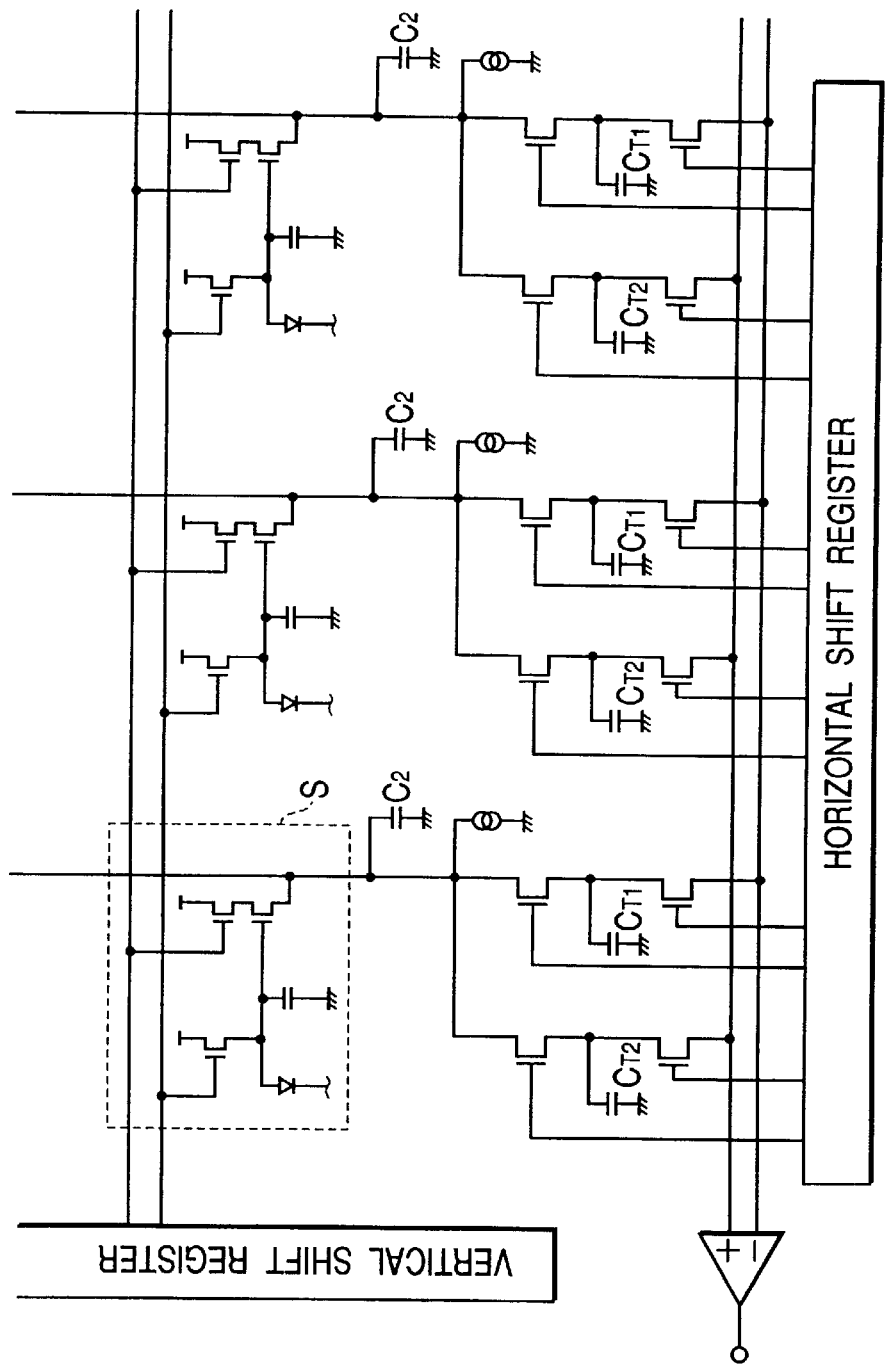
FIG. 12 is a schematic circuit diagram showing a circuit structure when arranging the pixels of FIG. 10 like a matrix.

FIG. 12 is a circuit diagram showing a photoelectric converter for outputting a signal through sequential scanning, constituted by arranging the photoelectric converters in FIG. 10 like a matrix.

The one-bit section in FIG. 10 (shown by symbol S in FIG. 12), that is, sensors and amplifiers (amplification transistor, selection transistor, and reset transistor) are arranged up to m sections in X direction and n sections in Y direction and the capacitors $C_{T2}$ and $C_{T1}$ are arranged on each signal line as described for FIG. 10.

Therefore, by alternately reading m×n signal outputs in a dark state and a bright state by shift registers in X and Y directions and applying subtraction processing to the outputs by a differential amplifier, it is possible to obtain signal outputs having less noises and high S/N. In any case, it is possible to drive pixels arranged like a matrix through continuous or intermittent irradiation with a light source of X-rays or the like as described above.

(Sixth Embodiment)

Figure 13:
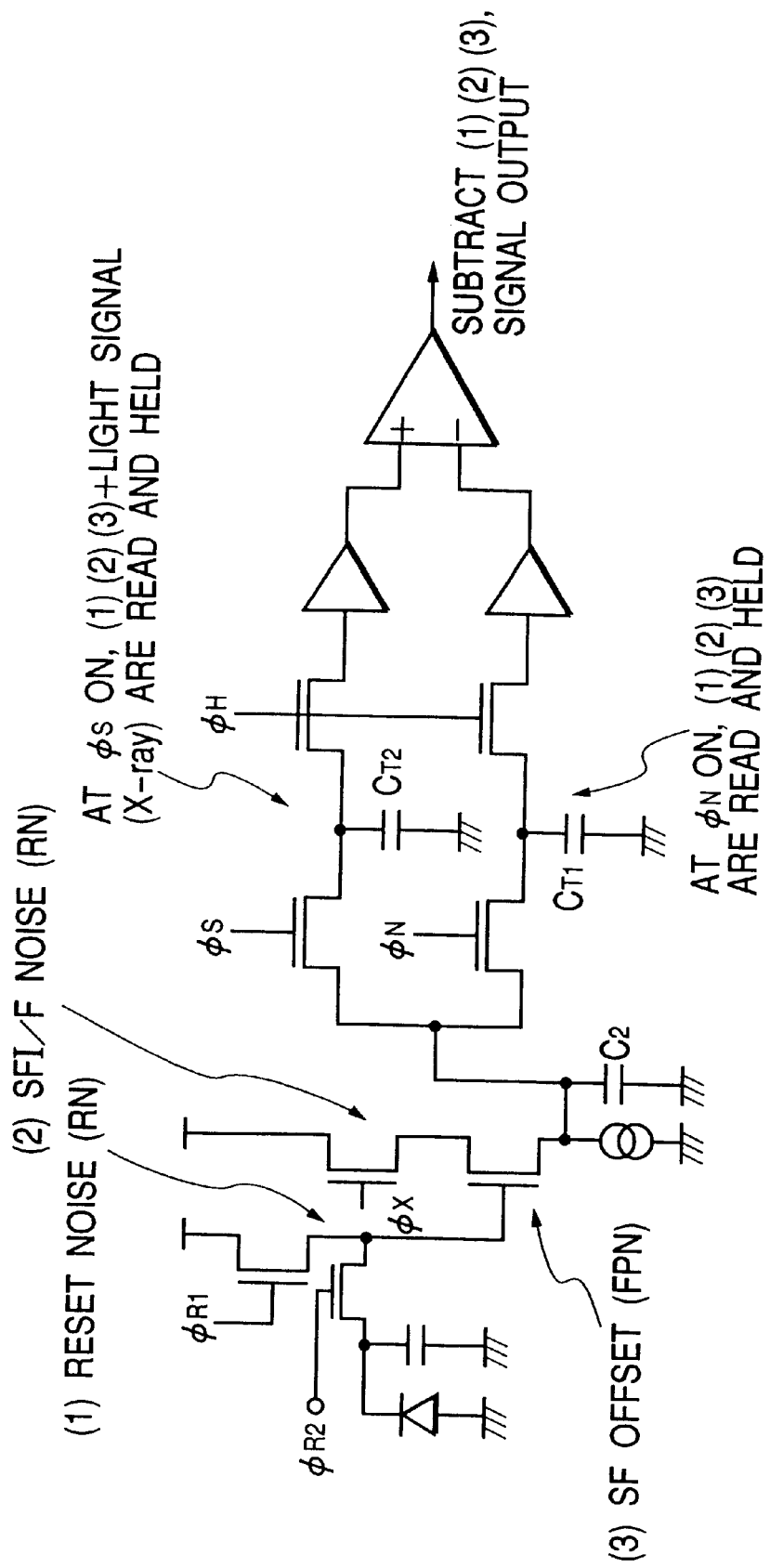
Figure 14:
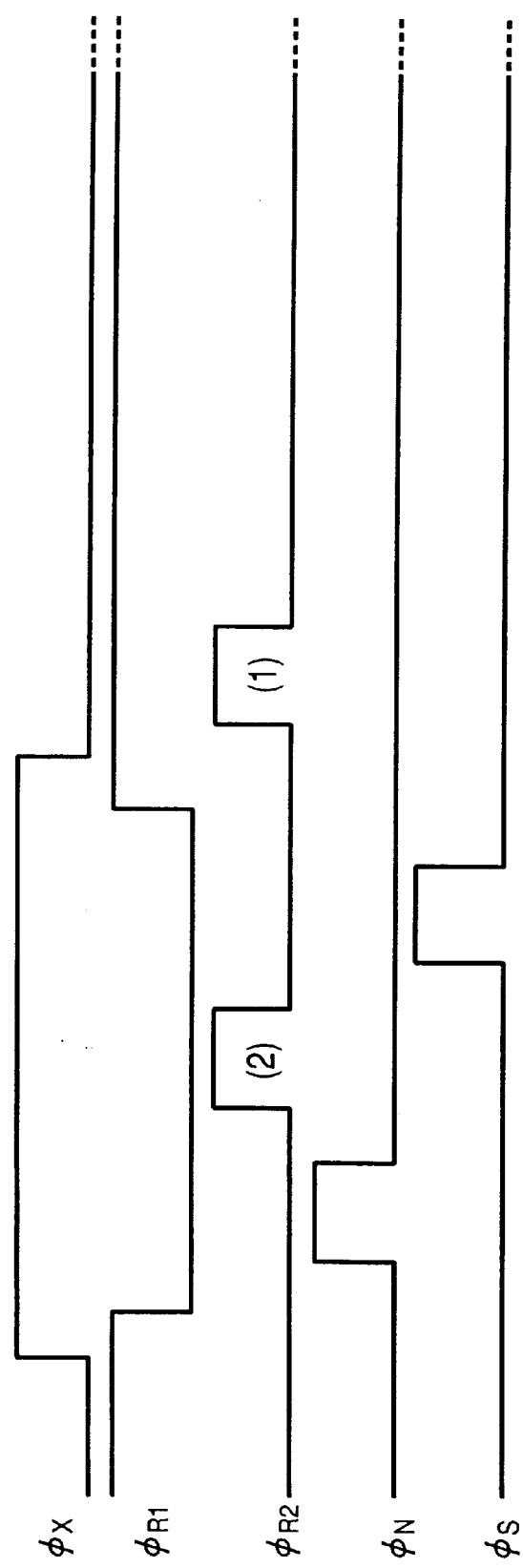

FIG. 13 shows still another example of circuit to be applied to the first to fourth embodiments. FIG. 14 shows timings of signals $\phi_X$, $\phi_{R1}$, $\phi_{R2}$, $\phi_N$, and $\phi_S$. In this case, symbol <1> denotes a random noise generated when applying reset with a reset transistor according to the reset pulse $\phi_{R1}$, <2> denotes a 1/f random noise generated while electric charges are accumulated in a source follower section, and <3> denotes an offset-fixing pattern noise generated in a source follower section. A sensor cell is reset by turning on the reset pulses $\phi_{R1}$ and $\phi_{R2}$ and then, accumulation by the sensor is started. In the case of an X-ray pulse, X-ray irradiation is started after the reset pulse $\phi_{R1}$ (pulse <1>) is turned off. It is also possible to continuously irradiate X-rays.

To remove the above three types of noises, capacitors $C_{T1}$ and $C_{T2}$ are arranged similarly to the case of the circuit of FIG. 13 to transfer signals accumulated in a dark state to the capacitor $C_{T1}$ in accordance with the pulse $\phi_N$ and signals accumulated in a bright state to the capacitor $C_{T2}$ in accordance with the pulse $\phi_S$, input the signals in the capacitors $C_{T2}$ and $C_{T1}$ to a differential amplifier in accordance with the pulse $\phi_H$, and perform subtraction processing. Thereby, it is possible to obtain a sensor signal excluding the above noises <1>, <2>, and <3>.

Figure 15:
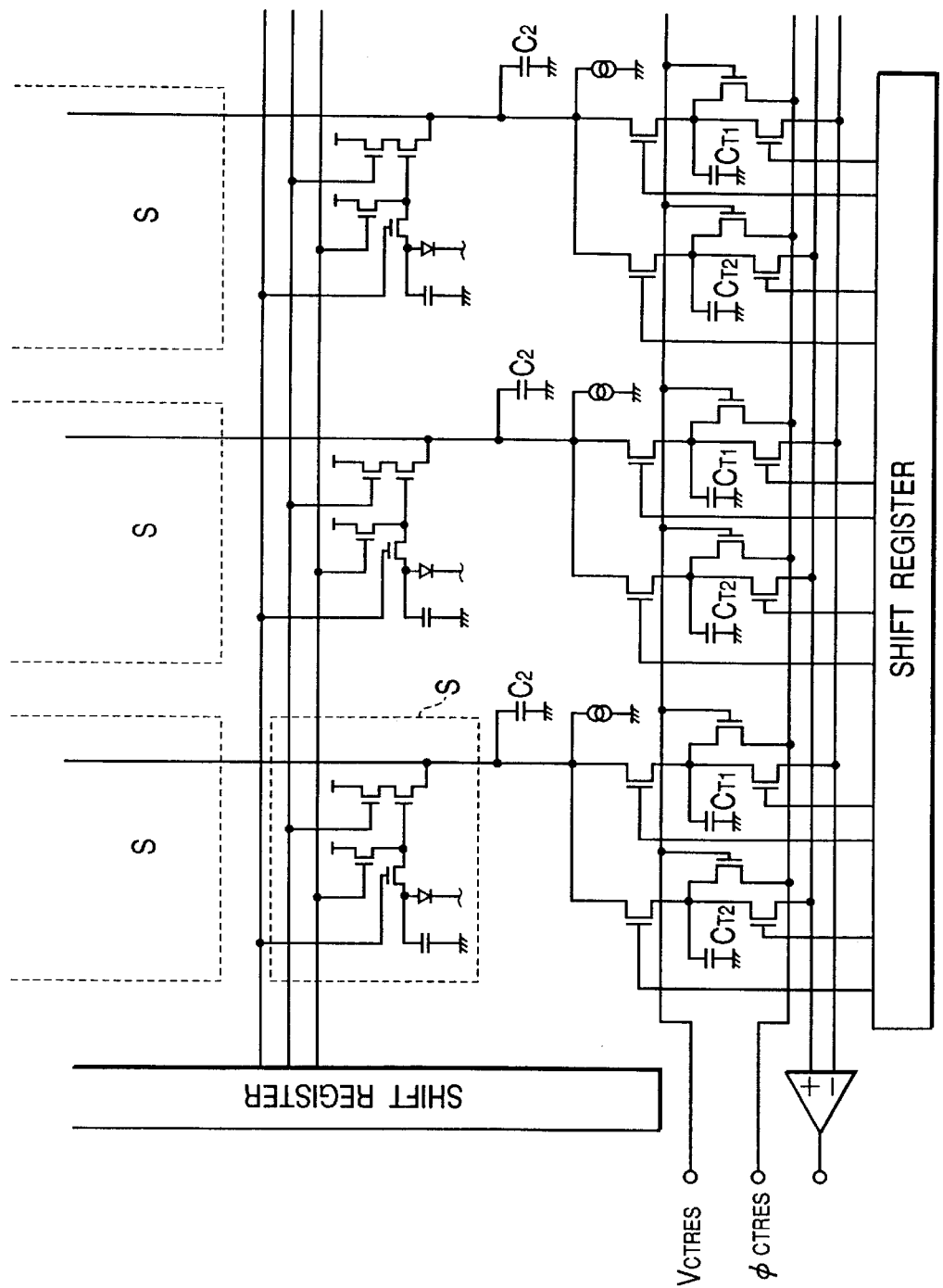
FIG. 15 is a schematic circuit diagram showing a circuit structure when the pixels of FIG. 13 like a matrix.

FIG. 15 is a schematic circuit diagram showing a photoelectric converter for outputting a signal through sequential scanning by arranging the photoelectric converters in FIG. 13 like a matrix. In FIG. 15, reset circuits $G_1$ and $G_2$ are built in. Also in the case of FIG. 12, it is possible to incorporate the reset circuits $G_1$ and $G_2$.

The one-bit section in FIG. 13 (shown by symbol S in FIG. 15), that is, sensors and amplifiers (amplification transistor, selection transistor, and reset transistor) are arranged up to m sections in X direction and n sections in Y direction and the capacitors $C_{T2}$ and $C_{T1}$ are arranged on each signal line as described for FIG. 23.

Therefore, by alternately reading m×n signal outputs in a dark state and a bright state by shift registers in X and Y directions and applying subtraction processing to the outputs by a differential amplifier, it is possible to obtain signal outputs having less noises and high S/N. Each photoelectric conversion element can be driven by continuous X-ray irradiation and pulses similarly to the case of FIG. 5 or 6.

Because n one-bit circuits are connected to each signal line, n overlapped capacitances $C_{gs}$ of the source and gate of an amplification transistor are connected in parallel. In the case of an X-ray area sensor, n is equal to 500 to 2,000. Therefore, signal-line wiring capacitance $C_2$ becomes equal to $C_{gs}$ ((500 to 2,000). Thus, when $C_{gs}$ increases, $C_2$ becomes a very large value.

To read only a static image, increase of $C_2$ is not a large problem. However, to perform dynamic-image like read, increase of $C_2$ greatly influences the read rate.

In the case of FIGS. 2, 3, 7, 8, and 9, a photoelectric conversion section having a light-receiving section (capacitance to be formed according to necessity), reset MOS, and source follower are formed on an insulating substrate and others are normally constituted with external circuits. Therefore, the time constant obtained as the product between the ON-resistance Ron and the capacitance $C_2$ of a transistor in a sensor cell is the largest problem.

Figure 16:
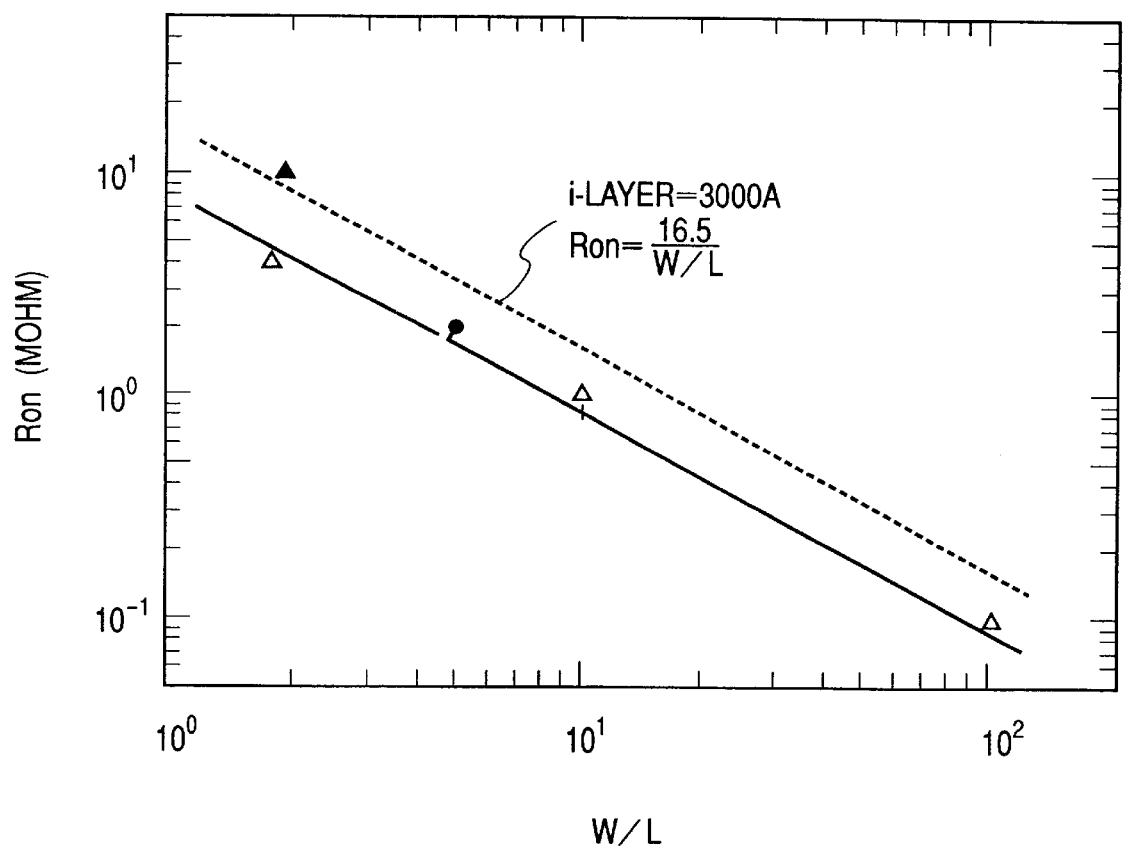
FIG. 16 is a graph showing the relation between ON-resistance, channel width (W), and channel length (L) of a transistor.

FIG. 16 shows an example of the data for the ratio between the ON-resistance, width (W), and channel length (L) of a transistor when using amorphous silicon as the material of the transistor. In FIG. 16, the broken line shows the calculated value when the thickness of amorphous silicon is 3,000 Å and the continuous line shows the calculated value when the thickness of the amorphous silicon is 1,000 Å.

Symbols ▲, △, and • denote measured data values.

Normally, W/L ranges between 2 and 10 and the ON-resistance Ron ranges between 1 and 10 MΩ. Because $C_2$ normally has 16 to 50 pF though depending on design, $RonC_2$ ranges between 10 and 50 (sec. Normally, a pulse length (e.g. $T_2$ in FIG. 5) requires a value three times larger than $RonC_2$ for read. Therefore, the above pulse length reaches 30 to 1,500 μsec. As described for FIG. 5, $T_2$ is equal to, for example, 66 μsec. Though this value can correspond to a switching speed in the minimum region, it may not be able to correspond to the switching speed in the normal range. Therefore, by decreasing the thickness of the i layer and increasing the W/L to 10 or more, it is possible to correspond to high-speed switching.

In the case of the embodiment shown in FIGS. 2 and 3, the W/L cannot be set to a large-enough value for design of a transistor. However, in the case of the laminated-type photoelectric converter shown in FIGS. 7, 8, and 9, it is possible to fabricate a transistor by using the substantially entire surface of a pixel or photoelectric-element forming region. Therefore, it is possible to completely reduce the Ron.

Figure 22:
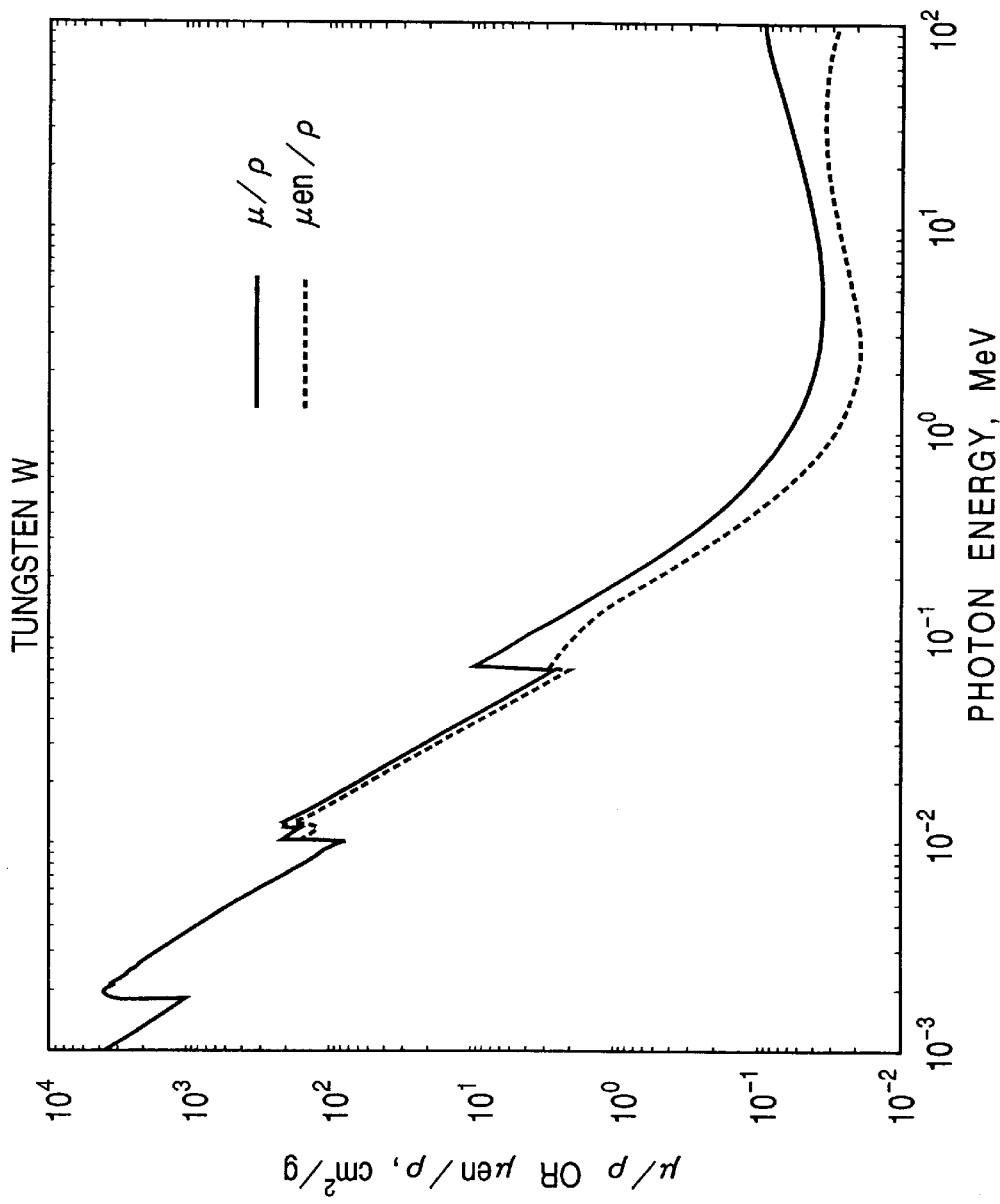

In the case of the embodiment in FIGS. 7, 8, and 22, a sufficient switching speed is obtained and therefore, a structure suitable for a dynamic image can be formed.

(Seventh Embodiment)

In the case of the present invention, it is also possible to form a photoelectric conversion element and a switching element on a single-crystal substrate.

Figure 17:
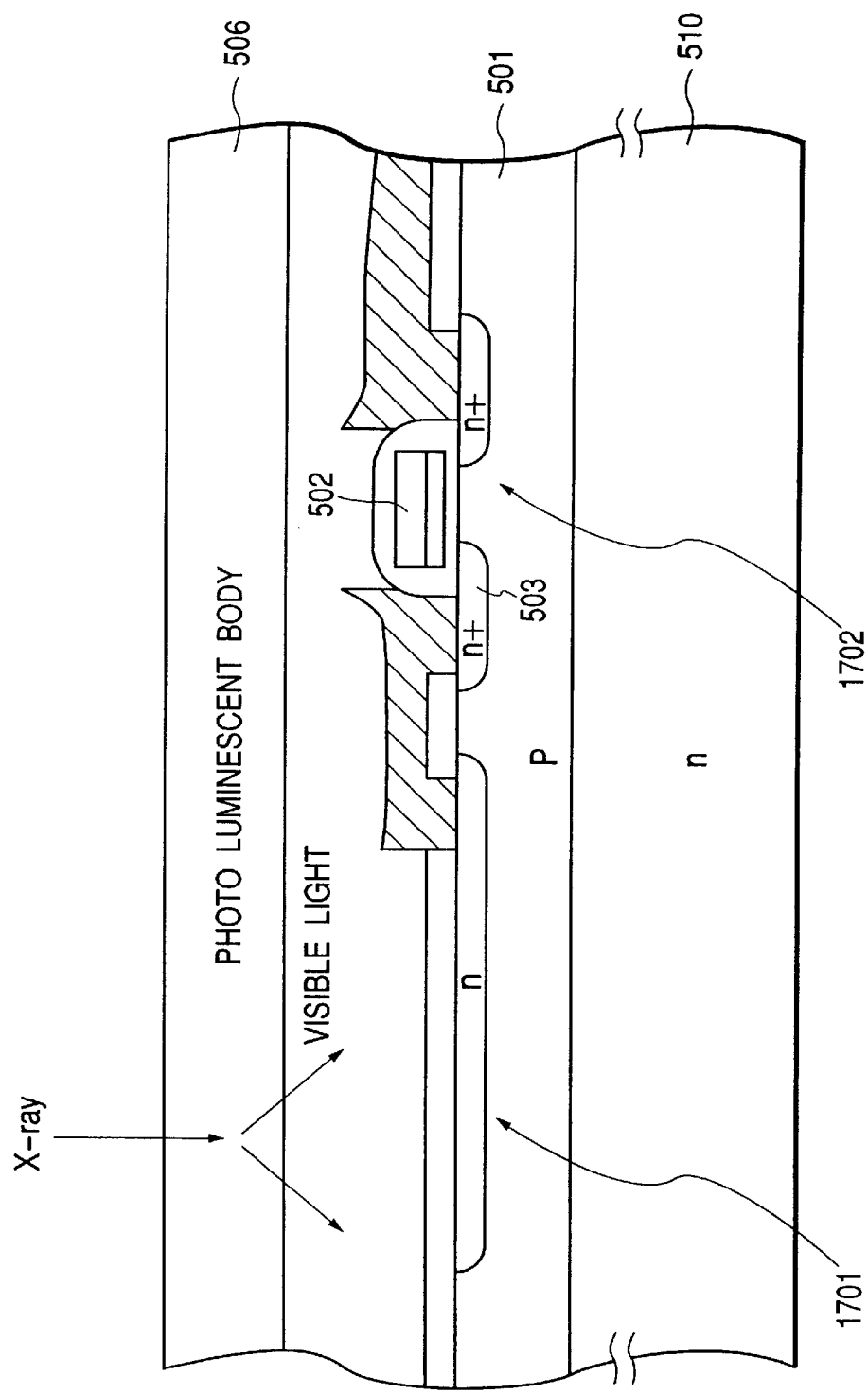
FIGS. 17, 18, 19 and 20 are schematic sectional views showing one-pixel portions of a radiation reader.

FIG. 17 shows a schematic sectional view of a photoelectric converter having a photoelectric conversion section 1701 and a MOS transistor 1702 on a Si single-crystal substrate 510. It is possible to form a photoelectric converter similarly to the case of forming a photoelectric conversion element and a TFT on the previously-described insulating substrate. However, when X-rays passing through a photoluminescent body (506) without being completely absorbed is absorbed in single crystal, extra carriers are produced in the Si single crystal and becomes noises against a signal caused by X-rays produced duel to the light emitted from the photoluminescent body.

Therefore, as shown in FIG. 17, it is necessary to electrically separate the substrate 510 from a sensor or switch region (in FIG. 17, they are electrically separated from each other in accordance with the P-type and N-type). It is preferable to set the thickness of the P-type region (p-well) 501 to a value two or three times or less the absorption coefficient of the luminescent wavelength of the photoluminescent body 506 so that the light wavelength-converted by the photoluminescent body 506 can be completely detected. The p-well 501 is electrically separated from the substrate 510 by applying a reverse bias. Then, X-rays are absorbed by only a value equivalent to the thickness (2 to 3 µm or less) of the p-well 501, noises due to direct X-ray absorption are decreased, and performances are improved.

By decreasing the thickness of the p-well (501), X-rays are less absorbed and the noise characteristic is improved. Though depending on a photoluminescent body, when using a Gd-based material as the photoluminescent body 506, 30 to 50% of X-rays are absorbed by the photoluminescent 506 and residual X-rays pass through the photoluminescent 506 without being wavelength-converted by the photoluminescent 506. However, when absorbing all the X-rays with an Si substrate, it is impossible to decide the information obtained though the absorption as a signal or noise. Approximately 1/10,000 X-rays of approx. 50 KeV are absorbed by Si single crystal having a thickness of 2 nm. Therefore, it is possible to reduce noise components by electrically separating from the thickness of the above region.

In the case of the photoelectric converter shown in FIG. 17, it is preferable to change the threshold voltage of the vertical selection switch 23 and that of the reset switch 24. The reason is described below.

First, the input MOS transistor 22 of the source follower of FIG. 1 must meet the following conditional expression (1).

$$V_{ds} > V_{gs} - V_{th2} \quad (1)$$

In the above expression, ds denotes a potential difference between drain and source, $V_{gs}$ denotes a potential difference between gate and source, and $V_{th2}$ denotes a threshold voltage.

In this case, it is assumed that the gate voltage when the reset switch 24 is turned on is $V_2$, the gate voltage when the vertical selection switch 23 is turned on is $V_3$, the drain voltage of the input MOS transistor 22 of the source follower is $V_1$, the threshold voltage of the reset switch 24 is $V_{th0}$, the threshold voltage of the vertical selection switch 23 is $V_{th1}$, and the threshold voltage of the input MOS transistor 22 of the source follower is $V_{th2}$.

When assuming a case in which both the reset switch 24 and the vertical selection switch 23 operate in a pentode region (region in which the bias (VDS) between source and drain is equal to or lower than a pinch-off voltage), the reset voltage $V_{sig0}$ is expressed by the following expression (2).

$$V_{sig0} = V_2 - V_{th0} \quad (2)$$

Then, when assuming that the current flowing through the vertical selection switch 23 is equal to the current flowing through the source follower circuit, the following expression (3) is effectuated.

$$Ia = K(V_3 - V_1 - V_{th1})^2 \quad (3)$$

$$K = 1/2 \times \mu \times C_{ox} \times W/L$$

µ: Mobility
$C_{ox}$: Gate oxide film capacity for unit area
W: Gate width
L: Gate length In this case, a gradual channel approximation is used to simplify the explanation.

By transforming the above expression, the following expression (4) is obtained.

$$V_1 = V_3 - V_{th1} - \sqrt{(Ia/K)} \quad (4)$$

By substituting the expressions (2) and (4) for the expression (1), the conditional expression for the source follower to operate in a linear operating region is shown by the following expression (5).

$$V_3 - V_{th1} - \sqrt{(Ia/K)} > V_2 - V_{th0} - V_{th2} \quad (5)$$

As an example in which the reset switch 24 and vertical selection switch 23 operate in the pentode region, the gate voltages $V_2$ and $V_3$ have used a voltage equal to a power-supply voltage and the threshold voltages of the switches 23 and 24 have used the same value. In this case, the expression (5) is transformed into the following expression (6).

$$\sqrt{(Ia/K)} < V_{th} \quad (6)$$

Thus, it is found that the current which can be flown through the source follower circuit is controlled by the threshold voltage of each switch.

Therefore, when change to multiple pixel is accelerated and the load which must be driven by a source follower circuit increases, it is more preferable to change threshold voltages of the vertical selection switch 23 and reset switch 24 so as to meet the above expressions. For example, it is desired to change the threshold value ($V_{th}$) of respective transistors by on the order of 0.5 V to 1.0 V.

Examples of raising the threshold voltage of the reset switch 24 shown in FIGS. 1 to 3 by 1 V compared to that of the vertical selection switch 23 are shown below.

(a) By constituting the gate metal of the reset switch 23 with chromium and the gate metal of the vertical selection switch 23 with aluminum, the threshold of the reset switch 24 becomes approx. 2.5 V and that of the vertical selection switch 23 becomes approx. 1.5 V.

(b) When constituting gate metals of the vertical selection switch 23 and reset switch 24 with aluminum, by applying +20 V to the potential $V_2$ of the gate metal of the reset switch 24 in common to all bits and moreover, grounding the potential $V_3$ of the gate metal of the vertical selection switch 23 and driving the switches 23 and 24 for approx. 3 hr at ordinary temperature, the threshold of the reset switch 24 becomes approx. 2.5 V and that of the vertical selection switch 23 is kept at approx. 1.5 V.

Then, to form a photoelectric conversion element, a field-effect transistor (MOS transistor) whose gate is connected with the output side of the photoelectric conversion element on the single-crystal substrate, vertical selection switch, and reset switch, a method for changing threshold voltages of the vertical selection switch and reset switch is described below.

Figure 18:
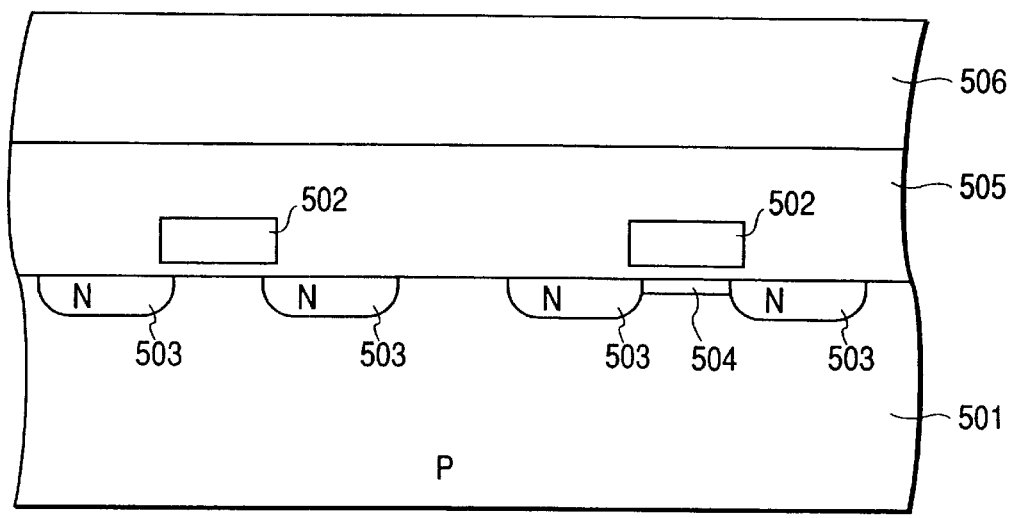

FIG. 18 is a sectional view showing a method for changing threshold voltages. In FIG. 18, symbol 501 denotes a semiconductor substrate, in which a P-type semiconductor is shown. Symbol 502 denotes a gate electrode formed on the semiconductor substrate 501 through a gate oxide film, which is formed with, for example, polysilicon or polycide. Symbol 503 denotes a source region and a drain region formed in the semiconductor substrate 501 through ion implantation or the like and having a conducting type opposite to that of the semiconductor substrate 501. A field-effect transistor is constituted with the above components. Moreover, to improve the durability, the upper side of each element is normally covered with a passivation film 505 made of SiN or the like to form a photoluminescent layer 506 on the film 505. Incoming X-rays are converted into the light in a wavelength band which can be photoelectric-converted (typically, visible light) by a photoelectric conversion element on the photoluminescent layer 506.

In this case, by forming a channel doped layer 504 in the channel region of only a desired transistor, it is possible to easily make the threshold voltage of the transistor different from that of other transistors. For example, in the case of the example of FIG. 18, by doping the layer 504 with an N-type ion species it is possible to lower the threshold voltage of a transistor compared to that of a transistor not doped with the N-type ion species. However, by doping the layer 504 with a P-type ion species, it is possible to raise the threshold voltage. The change value can be accurately determined by controlling the concentration of the channel doped layer 504.

An N-type field-effect transistor is described above as an example. However, it is needless to say that the same advantage can be also obtained from a P-type field-effect transistor. Moreover, for this embodiment, a case is described in which the channel doped layer of one transistor is controlled. However, the present invention is not restricted to the above case. It is also possible to use a plurality of channel doped layers by setting each of them to the optimum condition.

In the above description, the expression (3) of gradual channel approximation is used as an expression of the current flowing through a field-effect transistor. In addition to the case of the above ideal transistor, even if a slight shift occurs from the above expression because of progress of fining of a transistor, the advantage is not changed. It is essential to control the on-resistance of a field-effect transistor so as to meet the expression (1). For this reason, it is very effective means to change threshold voltages of a vertical selection switch and a reset switch.

Figure 19:
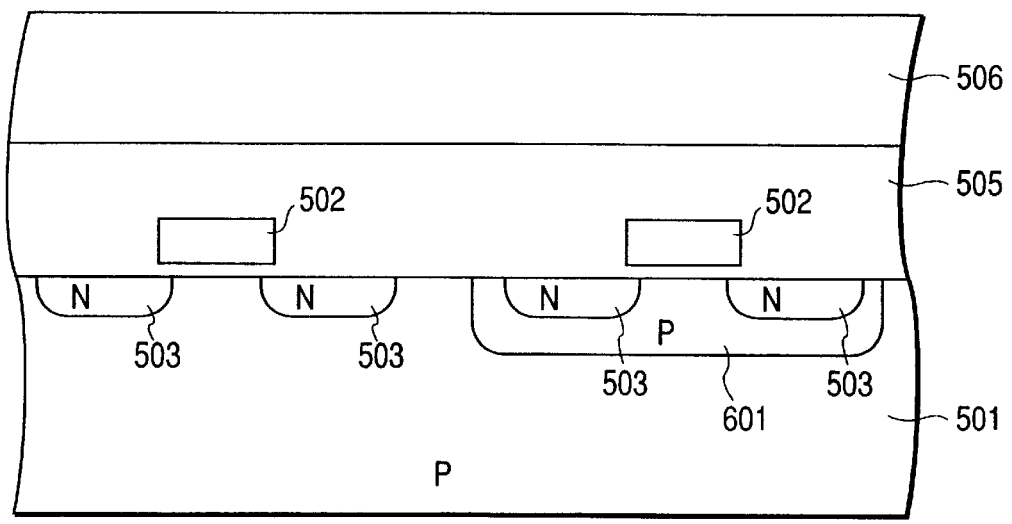

The structure shown in FIG. 19 is used for another method for changing threshold voltages. In FIG. 19, symbol 601 denotes a well region provided only for a desired transistor region. Other structures are the same as those shown in FIG. 18. Also by the structure of FIG. 19, it is possible to easily control the threshold voltage of a desired transistor.

Moreover, for FIG. 19, a case is described in which a P-type well region is formed in a P-type substrate. However, it is also possible to determine a desired threshold voltage by forming a plurality of P-type wells having different concentrations in an N-type substrate and controlling each concentration. Furthermore, though an N-type field-effect transistor is described as an example, it is needless to say that the same advantage can be obtained from a P-type field-effect transistor.

It is also effective to form the direct-type photoelectric conversion element shown in FIGS. 8 and 9 on a single-crystal substrate. In this case, it is preferable that a substrate can be electrically separated from a transistor similarly to the case of FIG. 17. Moreover, it is a matter of course that the circuit and operation previous described can be applied to a direct-type X-ray sensor.

It is already described that, when using a single-crystal substrate as a sensor substrate, transmitted X-rays to be absorbed in the substrate are decreased. Moreover, it is possible not only to make the region of a p-well or the like thin but also to form a shielding layer at the upper side.

For example, it is preferable to form the gate of a MOS transistor with a heavy metal instead of polysilicon. Specifically, it is preferable to form the electrode 502 of FIG. 17 wit a heavy metal (Pt, W, Mo, or Pd). In the case of a MOS transistor, it is preferable to form a metal into a double or triple structure and moreover, form the lower side with polysilicon and the upper side with a heavy-metal silicide or a heavy metal.

Figure 20:
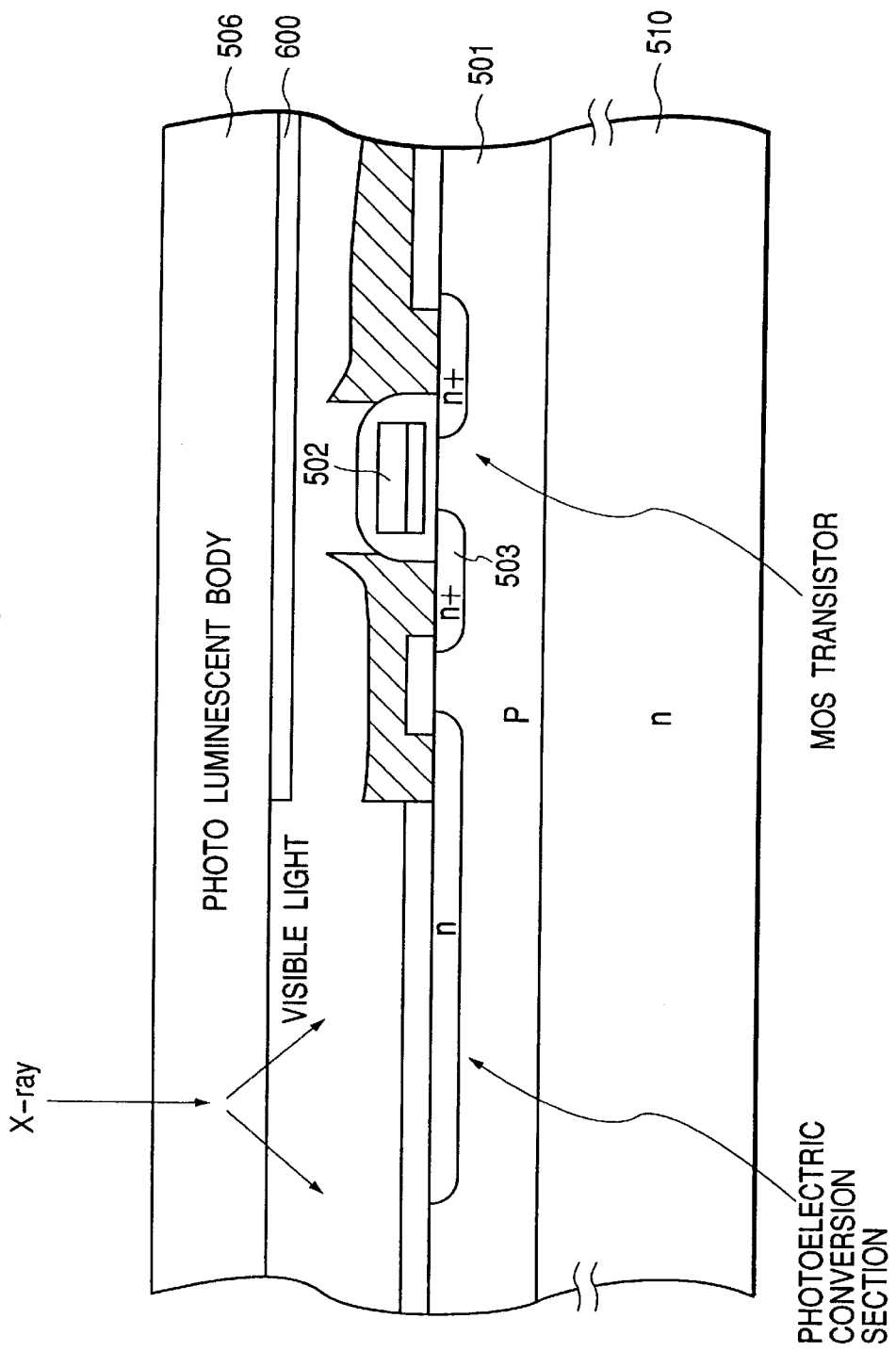

Furthermore, as shown in FIG. 20, it is possible to form an X-ray shielding layer 600 between the photoluminescent body and the substrate at a portion other than the light detecting section.

Figure 21:
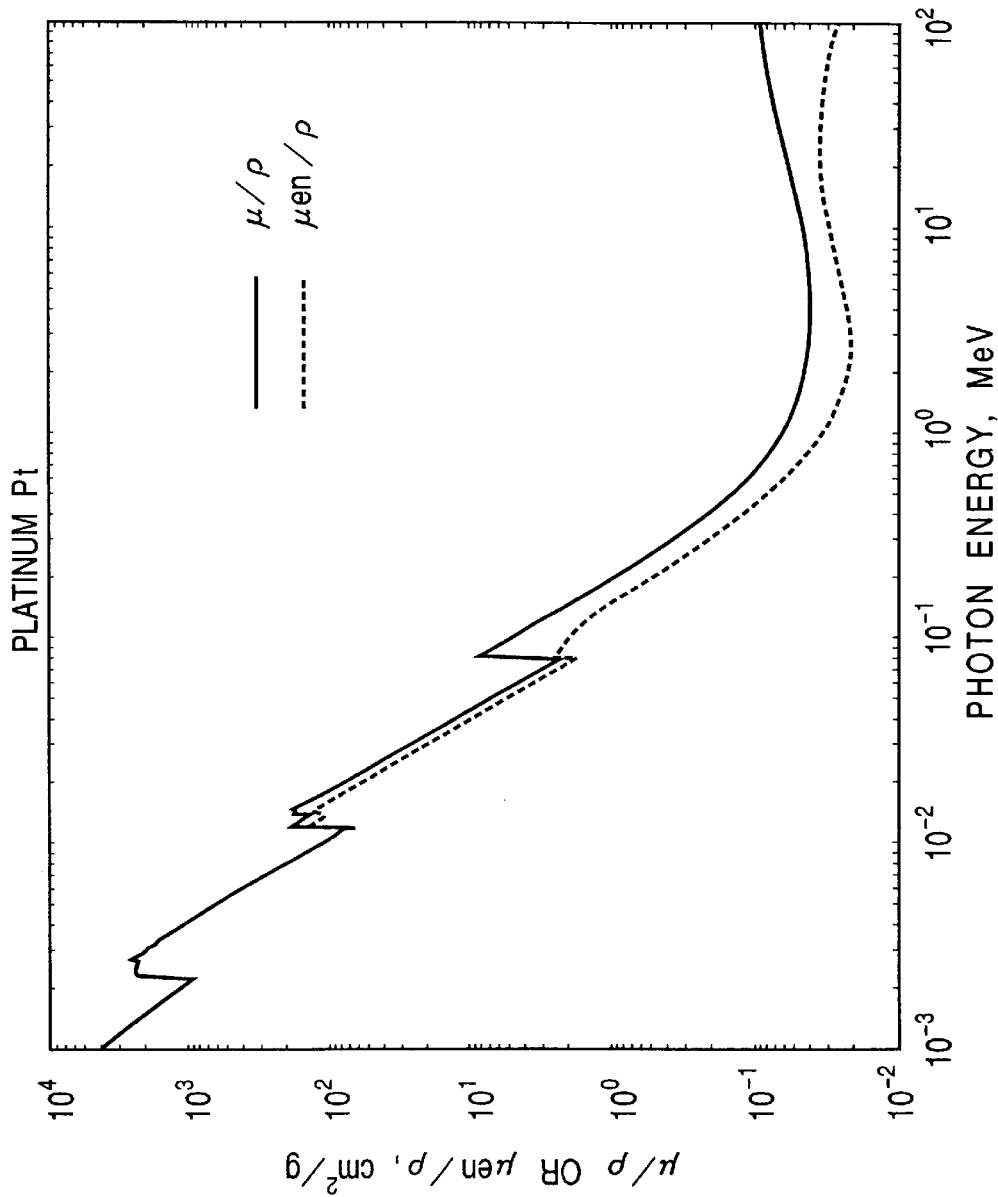
FIGS. 21 and 22 are illustrations showing X-ray absorbing characteristics of a shielding material.

FIGS. 21 and 22 show X-ray absorption characteristics of platinum Pt and tungsten W which can be used as shielding materials. For example, by using a shielding layer made of Pt and having a thickness of 10 $\mu$m, it is possible to obtain X-ray shielding effects of 13% and 91% against X-rays of 50 KeV and 10 KeV. Particularly, the shielding layer is every effective for a low energy.

When applying the direct-type structure shown in FIGS. 8 and 9 to a single-crystal substrate, it is possible to use a shielding layer made of a heavy metal (e.g. Pt, W, Mo, or Pd), which is the second Al layer 810 instead of Al.

As described above, the present invention makes it possible to prevent an output voltage from lowering due to increase of a parasitic capacitance caused when arranging a plurality of photoelectric conversion elements by sending signal charges generated in a photoelectric conversion element to the gate of a reading field-effect transistor and amplifying the signal charges with the reading field-effect transistor to output a signal.

Besides, an photoelectric conversion element may be arranged on at least any one of the reading field-effect transistor, selection switch means, and reset means, so as to allow the opening ratio to be improved.

Moreover, the present invention makes it possible to provide a photoelectric converter having higher sensitivity and more-advanced performance and radiation reader having the photoelectric converter.

What is claimed is:

1. A radiation reader comprising:
    a plurality of pixels, wherein each of said pixels comprises
        a photoelectric conversion element, a reading field-effect transistor having a gate for receiving signal charges generated in the photoelectric conversion element and a source and a drain for reading a signal corresponding to the signal charges accumulated in the gate selection-switch means set between the reading field-effect transistor and a power supply, and reset means for resetting the gate; wherein a semiconductor layer is included in which the photoelectric conversion element, reading field-effect transistor, selection-switch means, and reset means are formed on a common insulating support body; and a photoluminescent body is set on the photoelectric conversion element to absorb radiation and emit light in a wavelength band which can be detected by the photoelectric conversion element.

2. The radiation reader according to claim 1, wherein the photoelectric conversion element is set on at least one of the reading field-effect transistor, the selection switch means, and the reset means.

3. The radiation reader according to claim 1, wherein the selection switch and the reset means are respectively constituted with a field-effect transistor.

4. The radiation reader according to claim 3, wherein at least one of the selection switch means and the reset means which are respectively constituted with a field-effect transistor and the reading field-effect transistor has the semiconductor layer made of amorphous silicon.

5. The radiation reader according to claim 3, wherein at least one of the selection switch means and the reset means which are respectively constituted with a field-effect transistor and the reading field-effect transistor has the semiconductor layer made of polysilicon.

6. The radiation reader according to claim 3, wherein at least one of the selection switch means and the reset means which are respectively constituted with a field-effect transistor and the reading field-effect transistor has the semiconductor layer made of single-crystal silicon.

7. A radiation reader comprising:
a plurality of pixels, wherein each of said pixels comprises
a radiation reading element which includes an electric-charge discharging layer for absorbing radiation and discharging electric charges and in which at least the electric-charge discharging layer is constituted so as to be held by two conductive layers, a reading field-effect transistor having a gate for receiving signal charges generated in the radiation reading element and a source and a drain for reading a signal corresponding to the signal charges accumulated in the gate, selection-switch means set between the reading field-effect transistor and a power supply, and reset means for resetting the gate.

8. The radiation reader according to claim 7, wherein the radiation reading element is set on at least one of the reading field-effect transistor, the selection switch means, and the reset means.

9. The radiation reader according to claim 7, wherein the selection switch means and the reset means are respectively constituted with a field-effect transistor.

10. The radiation reader according to claim 9, wherein at least one of the selection switch means and the reset means which are respectively constituted with a field-effect transistor and the reading field-effect transistor is constituted by using amorphous silicon.

11. The radiation reader according to claim 9, wherein at least one of the selection switch means and the reset means which are respectively constituted with a field-effect transistor and the reading field-effect transistor is constituted by using polysilicon.

12. The radiation reader according to claim 9, wherein at least one of the selection switch means and the reset means which are respectively constituted with a field-effect transistor and the reading field-effect transistor is constituted by using single-crystal silicon.

13. A radiation reader comprising:
a phosphor absorbing radiation and emitting light; and
a plurality of pixels arranged in a two-dimensional matrix;
wherein each of said pixels has a photoelectric conversion element for receiving the light emitted from said phosphor and for generating charge and an amplifier circuit for amplifying a signal from said photoelectric conversion element, and
wherein said amplifier circuit comprises a plurality of thin film transistors formed on an insulating surface of a substrate.

14. The radiation reader according to claim 13, wherein said amplifier circuit is a source follower circuit.

15. The radiation reader according to claim 13, wherein said plurality of thin film transistors comprise a reading thin film transistor for inputting at a gate thereof a signal from said photoelectric conversion element, a reset thin film transistor for resetting the gate, and a selecting thin film transistor connected to source or drain of said reading thin film transistor.

16. The radiation reader according to claim 13, wherein said photoelectric conversion element is disposed between said amplifier circuit and said phosphor.

17. The radiation reader according to claim 13, wherein said thin film transistor is a polycrystalline silicon thin film transistor or a monocrystalline silicon thin film transistor.

18. A radiation reader comprising:
a phosphor absorbing radiation and emitting light; and
a plurality of pixels arranged in a two-dimensional matrix;
wherein each of said pixels has a photoelectric conversion element for receiving the light emitted from said phosphor and for generating charge, a reading transistor for reading signal from said photoelectric conversion element, and a source follower circuit including said reading transistor,
wherein said photoelectric conversion element is disposed between said phosphor and said reading transistor, and
wherein said source follower circuit comprises a reading thin film transistor for inputting at a gate thereof a signal from said photoelectric conversion element, a reset thin film transistor for resetting the gate, and a selection thin film transistor connected to source or drain of said reading thin film transistor.

19. A radiation reader comprising:
a phosphor absorbing radiation and emitting light; and
a plurality of pixels arranged in a two-dimensional matrix;
wherein each of said pixels has a photoelectric conversion element for receiving the light emitted from said phosphor and for generating charge and a reading transistor for reading signal from said photoelectric conversion element,
wherein said photoelectric conversion element is disposed between said phosphor and said reading transistor, and
wherein said reading transistor is a thin film transistor formed on an insulating surface of a substrate.

20. A radiation reader comprising:
a phosphor absorbing radiation and emitting light; and
a plurality of pixels arranged in a two-dimensional matrix;
wherein each of said pixels has a photoelectric conversion element for receiving the light emitted from said phosphor and for generating charge and a reading transistor for reading signal from said photoelectric conversion element, wherein said photoelectric conversion element is disposed between said phosphor and said reading transistor, and wherein said reading transistor is a polycrystalline or monocrystalline silicon thin film transistor.

21. A radiation reader comprising:
a plurality of pixels arranged in a two dimensional matrix for reading a signal from a direct conversion type sensor absorbing a radiation and generating charge,
wherein each of said pixels comprises an amplifying circuit for amplifying a signal from said direct conversion type sensor, and
wherein said amplifying circuit comprises a plurality of thin film transistors formed on an insulating surface of a substrate.

22. The radiation reader according to claim 21, wherein said amplifier circuit is a source follower circuit.

23. The radiation reader according to claim 21, wherein said plurality of thin film transistors comprise a reading thin film transistor inputting at a gate thereof a signal from said direct conversion type sensor, a reset thin film transistor for resetting the gate, and a selection thin film transistor connected to source or drain of said reading thin film transistor.

24. The radiation reader according to claim 21, wherein said thin film transistor is a polycrystalline or monocrystalline silicon thin film transistor.

25. A radiation reader comprising:
a plurality of pixels arranged in a two dimensional matrix for reading a signal from a direct conversion type sensor absorbing radiation and generating charge,
wherein each of said pixels comprises an amplifying circuit for amplifying a signal from said direct conversion type sensor, and
wherein said amplifying circuit is a source follower circuit comprising a reading thin film transistor inputting at a gate thereof a signal from said direct conversion type sensor, a reset thin film transistor for resetting the gate, and a selection thin film transistor connected to source or drain of said reading thin film transistor.

26. A radiation reader comprising:
a plurality of pixels arranged in a two dimensional matrix for reading a signal from a direct conversion type sensor absorbing radiation and generating charge,
wherein each of said pixels comprises an amplifying circuit for amplifying a signal from said direct conversion type sensor, and
wherein a transistor constituting said amplifying circuit is a polycrystalline or monocrystalline silicon thin film transistor.

27. A radiation reader comprising:
a wavelength converter for converting an incident radiation into a light;
a plurality of pixels arranged in a two-dimensional matrix, wherein each pixel comprises
a first, second, and third thin film transistor, and a cell for converting the light into an electric charge, wherein said cell has a first electrode set at a constant potential and a second electrode connected commonly to a gate of said first transistor and to one of source and drain of said third transistor, one of source and drain of said first transistor is connected to an output line, the other of the source and drain of said first transistor is connected to one of source and drain of said second transistor, the other of the source and drain of said second transistor is set at a constant potential, a gate of said second transistor is connected to a first gate line, the other of the source and drain of said third transistor is set at a constant potential, and a gate of said third transistor is connected to a second gate line; and
a scanning circuit for applying a voltage to said first gate line to reset a signal charge of said cell, and for applying a voltage to said second gate line to set said second transistor at a conducting state, thereby charge amplifying and reading the signal from said first transistor;
wherein said output line is connected to each of constant current sources and to ones of source and drain of row selection transistors, the others of the source and drain of said row selection transistors are connected to an output line common to the rows, and gates of said row selection transistors are connected to a horizontal scanning circuit, thereby outputting a signal serially per each column by said horizontal scanning circuit.

28. A radiation reader according to claim 27, further comprising an A/D conversion circuit.

29. A radiation reader according to claim 27, further comprising a memory for storing the signal.

30. A radiation reader according to claim 27, wherein at least, said cell and said first, second and third transistors are provided on an insulating substrate.

31. A radiation reader according to claim 27, further comprising charge storaging capacitors each for each of the pixels, one terminal of said charge storaging capacitor is connected to said cell, the gate of said first transistor, and one of source and drain of said third transistor, and the other terminal of said charge storaging capacitor is set at a constant potential.

32. A radiation reader according to claim 27, further comprising capacitors two of which are provided for each one of said signal lines; fourth and fifth transistors for selecting either one of said two capacitors according to the signal from said horizontal scanning circuit; and sixth and seventh transistors for reading selectively the signal stored in said capacitor.

33. A radiation reader comprising:
a converter for converting an incident radiation directly into an electric charge;
a plurality of pixels including said converter arranged in a two-dimensional matrix, wherein each pixel comprises a first, second, and third thin film transistor and a capacitor for storing a signal charge, wherein one terminal of said converter is connected to a first electrode of said capacitor, a second electrode of said capacitor is connected commonly to a gate of said first transistor and to one of source and drain of said third transistor, one of source and drain of said first transistor is connected to an output line, the other of the source and drain of said first transistor is connected to one of source and drain of said second transistor, the other of the source and drain of said second transistor is set at a constant potential, a gate of said second transistor is connected to a first gate line, the other of the source and drain of said third transistor is set at a constant potential, and a gate of said third transistor is connected to a second gate line; and
a scanning circuit for applying a voltage to said first gate line to reset a signal charge of said capacitor, and for applying a voltage to said second gate line to set said second transistor at a conducting state, thereby charge amplifying and reading a signal from said first transistor;

wherein an output line is connected to each of a constant current source and to one of source and drain of a row selection transistor, the others of the source and drain of row selection transistors are connected to an output line common to rows, and gates of said row selection transistors are connected to a horizontal scanning circuit, thereby outputting a signal serially per each row by said horizontal scanning circuit.

34. A radiation reader according to claim 33, further comprising an A/D conversion circuit.

35. A radiation reader according to claim 33, further comprising a memory for storing the signal.

36. A radiation reader according to claim 33, wherein at least said capacitor, and first, second and third transistors are provided on an insulating substrate.

37. A radiation reader according to claim 33, further comprising capacitors two of which are provided for each one of said signal lines; fourth and fifth transistors for selecting either one of said two capacitors according to a signal from said horizontal scanning circuit; and sixth and seventh transistors for reading selectively the signal stored in said capacitor.

38. A radiation reader comprising:

a phosphor absorbing radiation and emitting light; and a plurality of pixels arranged in a two dimensional matrix;

wherein each of said pixels comprises a photoelectric conversion section receiving light emitted from said phosphor and generating charge; and a reading MOS transistor for reading a signal from said photoelectric conversion element;

wherein said photoelectric conversion section has a first conductivity type semiconductor layer formed in a second conductivity type semiconductor region formed on a semiconductor substrate of the first conductivity type;

wherein said reading MOS transistor has source and drain regions of the first conductivity type formed in said second conductivity type semiconductor region;

wherein a thickness of said second conductivity type semiconductor region is sufficient to absorb the light emitted from said phosphor; and wherein a reverse bias is applied between said semiconductor substrate of the first conductivity type and said second conductivity type semiconductor region, thereby reducing noise due to an absorbing a radiation transmitted through said phosphor.

39. The radiation reader according to claim 38, wherein the gate of said reading MOS transistor has a heavy metal layer or heavy metal silicide layer shielding the radiation.

40. The radiation reader according to claim 39, wherein between said reading MOS transistor and said phosphor, a shielding layer for shielding the radiation is provided.

* * * * *

UNITED STATES PATENT AND TRADEMARK OFFICE
CERTIFICATE OF CORRECTION

PATENT NO. : 6,600,160 B2
DATED : July 29, 2003
INVENTOR(S) : Isao Kobayashi, et al.

It is certified that error appears in the above-identified patent and that said Letters Patent is hereby corrected as shown below:

Column 1,
Line 12, "(α-rays," should read -- α-rays, --.

Column 3,
Line 6, "when the pixels" should read -- when arranging the pixels --.
Line 23, "(α-rays," should read -- α-rays, --.

Column 4,
Line 34, "connected" should read -- connected to --.

Column 7,
Line 40, "insulting" should read -- insulating --.

Column 10,
Line 51, "(sec." should read -- sec. --.

Column 11,
Line 18, "due 1" should read -- due --.

Column 14,
Line 15, "previous" should read -- previously --.
Line 25, "wit" should read -- with --.
Line 53, "an photoelectric" should read -- a photoelectric --.

Column 20,
Line 17, "an absorbing a radiation" should read -- absorption of radiation--.

Signed and Sealed this

Twenty-fifth Day of May, 2004

JON W. DUDAS
*Acting Director of the United States Patent and Trademark Office*